US012796129B2

(12) United States Patent
Hasumi

(10) Patent No.: US 12,796,129 B2
(45) Date of Patent: Nov. 10, 2026

(54) IMAGING APPARATUS AND ELECTRONIC DEVICE

(71) Applicant: SONY SEMICONDUCTOR SOLUTIONS CORPORATION, Kanagawa (JP)

(72) Inventor: Ryoji Hasumi, Kanagawa (JP)

(73) Assignee: Sony Semiconductor Solutions Corporation, Kanagawa (JP)

( * ) Notice: Subject to any disclaimer, the term of this patent is extended or adjusted under 35 U.S.C. 154(b) by 696 days.

(21) Appl. No.: 17/910,578

(22) PCT Filed: Jan. 28, 2021

(86) PCT No.: PCT/JP2021/003105

§ 371 (c)(1),
(2) Date: Sep. 9, 2022

(87) PCT Pub. No.: WO2021/186911

PCT Pub. Date: Sep. 23, 2021

(65) Prior Publication Data

US 2023/0170360 A1 Jun. 1, 2023

(30) Foreign Application Priority Data

Mar. 18, 2020 (JP) ................................ 2020-047531

(51) Int. Cl.
*H10F 39/00* (2025.01)
*H10F 39/18* (2025.01)

(52) U.S. Cl.
CPC ....... *H10F 39/80373* (2025.01); *H10F 39/18* (2025.01)

(58) Field of Classification Search
CPC ................ H10F 39/802; H10F 39/813; H10F 39/80373; H10F 39/18
See application file for complete search history.

(56) References Cited

U.S. PATENT DOCUMENTS 6,150,670 A 11/2000 Faltermeier et al.
6,358,867 B1 3/2002 Tews et al.
(Continued)

FOREIGN PATENT DOCUMENTS

CN 101924135 A 12/2010
CN 102693989 A 9/2012
(Continued)

OTHER PUBLICATIONS

E. A. Lewis and E. A. Irene, The Effect of Surface Orientation on Silicon Oxidation Kinetics, Sep. 1987, Journal of The Electrochemical Society, vol. 134, No. 9, pp. 2332-2339. (Year: 1987).*
(Continued)

*Primary Examiner* — Jeff W Natalini
*Assistant Examiner* — Rose Keagy
(74) *Attorney, Agent, or Firm* — SHERIDAN ROSS P.C.

(57) ABSTRACT

To provide an imaging apparatus and an electronic device of which transfer efficiency of electric charges is superior. The imaging apparatus includes a semiconductor substrate and a vertical transistor provided on the semiconductor substrate. The semiconductor substrate is provided with a hole portion that opens on a side of a first principal plane. The vertical transistor has a first gate electrode provided inside the hole portion and a first gate insulating film provided between an inner wall of the hole portion and the first gate electrode. A cross section of the first gate electrode cut along a plane parallel to the first principal plane has a shape being elongated in a direction of a crystallographic orientation of the semiconductor substrate.

20 Claims, 19 Drawing Sheets

(56) References Cited

U.S. PATENT DOCUMENTS

| | | | | |
|---|---|---|---|---|
| 6,362,040 | B1 * | 3/2002 | Tews | H01L 21/31662 438/386 |
| 2004/0082197 | A1 | 4/2004 | Gluschenkov et al. | |
| 2009/0303371 | A1 | 12/2009 | Watanabe et al. | |
| 2009/0322919 | A1 | 12/2009 | Itonaga | |
| 2012/0007151 | A1 * | 1/2012 | Yoshimori | H10D 62/405 257/329 |
| 2013/0076934 | A1 * | 3/2013 | Maeda | H10F 39/802 348/222.1 |
| 2013/0175582 | A1 | 7/2013 | Ihara | |
| 2014/0151533 | A1 | 6/2014 | Watanabe | |
| 2014/0252420 | A1 * | 9/2014 | Yi | H10F 39/199 257/229 |
| 2015/0069471 | A1 * | 3/2015 | Kawamura | H10F 39/812 438/60 |
| 2017/0207263 | A1 * | 7/2017 | Park | H10F 39/8063 |
| 2019/0123079 | A1 | 4/2019 | Kudoh | |

FOREIGN PATENT DOCUMENTS

| | | | |
|---|---|---|---|
| CN | 102779745 | A | 11/2012 |
| CN | 105009292 | A | 10/2015 |
| CN | 106169489 | A | 11/2016 |
| CN | 108780803 | A | 11/2018 |
| JP | 2003-515952 | | 5/2003 |
| JP | 2004-153256 | | 5/2004 |
| JP | 2009-049260 | | 3/2009 |
| JP | 2010-114273 | | 5/2010 |
| JP | 2011-014751 | | 1/2011 |
| JP | 2012-018973 | | 1/2012 |
| JP | 2013-069846 | | 4/2013 |
| JP | 2015-053411 | | 3/2015 |
| JP | 2017-183636 | | 10/2017 |

OTHER PUBLICATIONS

International Search Report and Written Opinion prepared by the Japan Patent Office on Mar. 22, 2021, for International Application No. PCT/JP2021/003105, 4 pgs.

* cited by examiner

IMAGING APPARATUS AND ELECTRONIC DEVICE

CROSS REFERENCE TO RELATED APPLICATIONS

This application is a national stage application under 35 U.S.C. 371 and claims the benefit of PCT Application No. PCT/JP2021/003105, having an international filing date of 28 Jan. 2021, which designated the United States, which PCT application claimed the benefit of Japanese Patent Application No. 2020-047531, filed 18 Mar. 2020, the entire disclosures of each of which are incorporated herein by reference.

TECHNICAL FIELD

The present disclosure relates to an imaging apparatus and an electronic device.

BACKGROUND ART

In solid-state imaging elements including a photodiode and a transistor that reads an electric charge having been photoelectrically converted by the photodiode, a configuration is known in which a transfer transistor for transferring the electric charge is vertically disposed for the purpose of reducing an area occupied by the element and enlarging a light-receiving area of the photodiode (for example, refer to PTL 1). The vertical transistor includes: a hole portion formed in a semiconductor substrate; a gate insulating film formed so as to cover an inner wall of the hole portion; and a gate electrode formed so as to fill the inside of the hole portion via the gate insulating film.

CITATION LIST

Patent Literature

[PTL 1]
JP 2011-14751 A

SUMMARY

Technical Problem

The inner wall of the hole portion formed inside the semiconductor substrate has various crystallographic planes. Representative crystallographic planes of a semiconductor material (for example, Si) include a (110) plane and a (100) plane being inclined by 45 degrees relative to the (110) plane. Since the (110) plane and the (100) plane differ from each other in terms of rates of thermal oxidation, a difference in film thickness in accordance with crystallographic planes is created in the gate insulating film formed on the inner wall of the hole portion. The difference in film thickness may possibly act as a potential barrier and inhibit transfer of an electric charge.

The present disclosure has been made in view of such circumstances and an object thereof is to provide an imaging apparatus and an electronic device with superior electric charge transfer efficiency.

Solution to Problem

An imaging apparatus according to an aspect of the present disclosure includes: a semiconductor substrate; and a vertical transistor provided on the semiconductor substrate, wherein the semiconductor substrate is provided with a hole portion that opens on a side of a first principal plane, the vertical transistor has a first gate electrode provided inside the hole portion and a first gate insulating film provided between an inner wall of the hole portion and the first gate electrode, and a cross section of the first gate electrode cut along a plane parallel to the first principal plane has a shape being elongated in a direction of a crystallographic orientation <100> of the semiconductor substrate.

Accordingly, a (110) plane on which the first gate insulating film is thickly formed among the inner wall of the hole portion is disposed near an end in a long axis direction of a cross section of the first gate electrode cut along a plane parallel to the first principal plane. In addition, due to thermal oxidation of the (110) plane, a thick-film portion of the first gate insulating film is formed near an end in the long axis direction. By respectively disposing a region (a thick-film region) in contact with the thick film portion in the semiconductor substrate at a source terminal and a drain terminal of the vertical transistor, the potential barrier created in the thick-film region can be offset and reduced by each potential gradient created at the source terminal and the drain terminal. Accordingly, a transfer efficiency of an electric charge $e^-$ of the vertical transistor can be improved.

An electronic device according to an aspect of the present disclosure includes: an optical component; an imaging apparatus into which light transmitted through the optical component is incident; and a signal processing circuit configured to process a signal output from the imaging apparatus, wherein the imaging apparatus includes: a semiconductor substrate; and a vertical transistor provided in the semiconductor substrate, the semiconductor substrate is provided with a hole portion that opens on a side of a first principal plane, the vertical transistor has a first gate electrode provided inside the hole portion and a first gate insulating film provided between an inner wall of the hole portion and the first gate electrode, and a cross section of the first gate electrode cut along a plane parallel to the first principal plane has a shape being elongated in a direction of a crystallographic orientation <100> of the semiconductor substrate. Accordingly, an electronic device including an imaging apparatus with superior electric charge transfer efficiency can be provided.

DESCRIPTION OF EMBODIMENTS

Embodiments of the present disclosure will be described below with reference to the drawings. In descriptions of the drawings referred to in the following description, same or similar portions will be denoted by same or similar reference signs. However, it should be noted that the drawings are schematic and relationships between thicknesses and planar dimensions, ratios of thicknesses of respective layers, and the like are different from actual ones. Accordingly, specific thicknesses and dimensions should be determined by taking the following description into consideration. In addition, it goes without saying that the drawings also include portions having different dimensional relationships and ratios from each other.

In addition, it is to be understood that definitions of directions such as upward and downward in the following description are merely definitions provided for the sake of brevity and are not intended to limit technical ideas of the present disclosure. For example, it is obvious that when an object is observed after being rotated by 90 degrees, up-down is converted into and interpreted as left-right, and when an object is observed after being rotated by 180 degrees, up-down is interpreted as being inverted.

Further, in the following description, a "plan view" means a view in a normal direction of a surface 111*a* of a semiconductor substrate 111 to be described later.

Embodiment (Overall Configuration Example)

Figure 1:
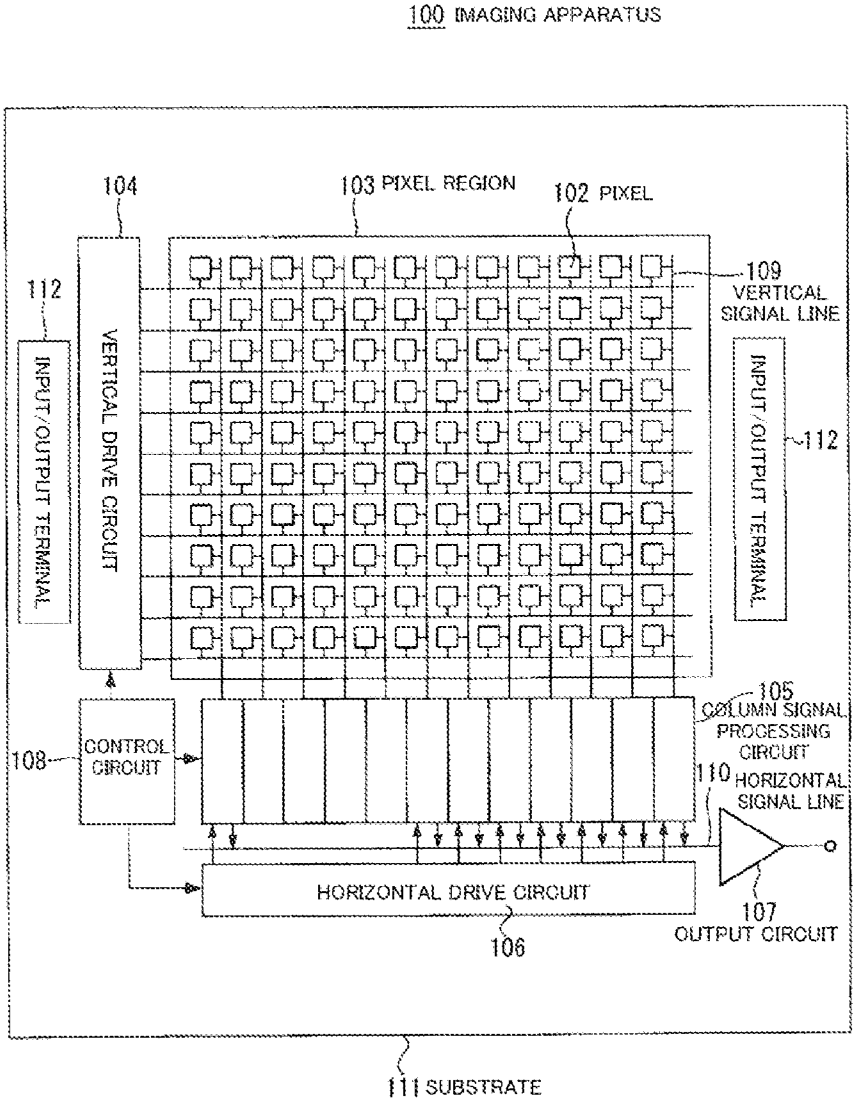
FIG. 1 is a diagram showing a configuration example of an imaging apparatus according to an embodiment of the present disclosure.

FIG. 1 is a diagram showing a configuration example of an imaging apparatus 100 according to an embodiment of the present disclosure. The imaging apparatus 100 shown in FIG. 1 is, for example, a CMOS solid-state imaging apparatus. As shown in FIG. 1, the imaging apparatus 100 is configured to have a pixel region (a so-called imaging region) 103, in which pixels 102 including a plurality of photoelectric conversion elements are regularly arranged two-dimensionally, and a peripheral circuit portion on a semiconductor substrate 111 (for example, a silicon substrate). The pixel 102 is configured to have a photodiode serving as a photoelectric conversion element, and a plurality of pixel transistors (so-called MOS transistors). The plurality of pixel transistors can be constituted of three transistors including a transfer transistor, a reset transistor, and an amplifying transistor. The plurality of pixel transistors can also be constituted of four transistors by adding a selective transistor to the above three transistors. Since an equivalent circuit of a unit pixel is the same as usual, a detailed description thereof will be omitted.

The pixel 102 can also have a shared pixel structure. The shared pixel structure is constituted of a plurality of photodiodes, a plurality of transfer transistors, one shared floating diffusion, and one each of other shared pixel transistors. In other words, in the shared pixel structure, photodiodes and transfer transistors which constitute a plurality of unit pixels are configured so as to share one each of other pixel transistors with the exception of transfer transistors.

The peripheral circuit portion includes a vertical drive circuit 104, column signal processing circuits 105, a horizontal drive circuit 106, an output circuit 107, a control circuit 108, and the like.

The control circuit 108 receives input clocks and data instructing an operation mode and the like and outputs data such as internal information of the imaging apparatus. That is, the control circuit 108 generates clock signals and control signals serving as references for operations of the vertical drive circuit 104, the column signal processing circuits 105, the horizontal drive circuit 106, and the like on the basis of vertical sync signals, horizontal sync signals and master clocks. In addition, the control circuit 108 inputs these signals to the vertical drive circuit 104, the column signal processing circuits 105, the horizontal drive circuit 106, and the like.

The vertical drive circuit 104 is constituted of, for example, a shift register, selects a pixel drive wiring, supplies pulses for driving pixels to the selected pixel drive wiring, and drives the pixels for each row. That is, the vertical drive circuit 104 sequentially selects and scans the respective pixels 102 in the pixel region 103 in the vertical direction for each row and supplies pixel signals based on signal charges generated in accordance with an amount of light received in the photoelectric conversion element of each of the pixels 102 to the column signal processing circuits 105 through vertical signal lines 109.

The column signal processing circuits 105 are disposed, for example, for each column of the pixels 102 and perform signal processing such as noise reduction of signals output from the pixels 102 in one row for each pixel row. That is, the column signal processing circuits 105 perform signal processing such as CDS for removing fixed pattern noise unique to the pixels 102, signal amplification, and AD conversion. Horizontal selection switches (not shown) are provided at output stages of the column signal processing circuits 105 to be connected between the output stages and the horizontal signal line 110.

The horizontal drive circuit 106 is constituted of, for example, a shift register, sequentially selects each of the column signal processing circuits 105 by sequentially outputting horizontal scan pulses, and outputs pixel signals from each of the column signal processing circuits 105 to the horizontal signal line 110.

The output circuit 107 performs signal processing on signals sequentially supplied from each of the column signal processing circuits 105 through the horizontal signal line 110 and outputs the processed signals. For example, the output circuit 107 may only perform buffering, or may perform black level adjustment, column variation correction, various kinds of digital signal processing, and the like. Input/output terminals 112 exchange signals with the outside.

(Configuration Example of Pixel)

Figure 2:
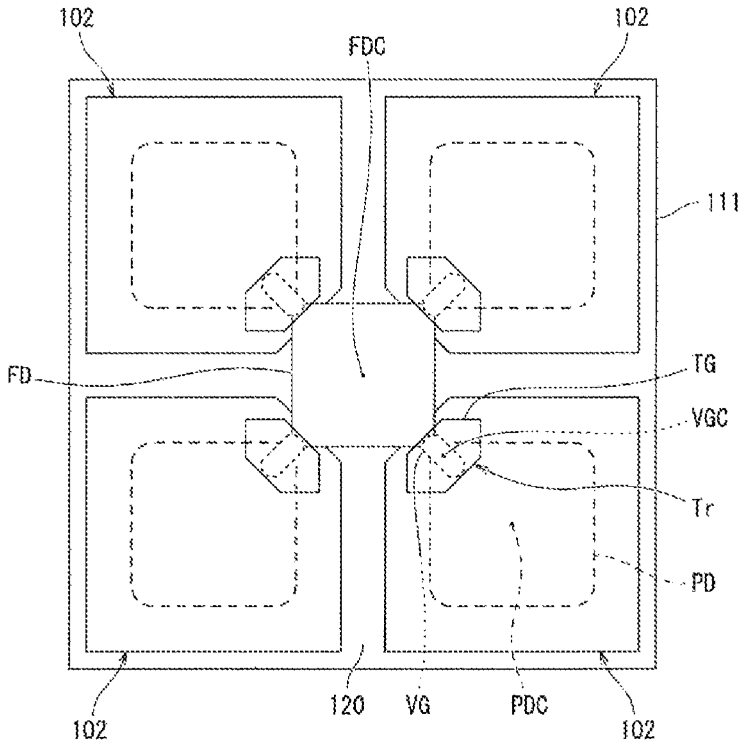
FIG. 2 is a plan view showing an example of a pixel sharing structure of an imaging apparatus according to the embodiment of the present disclosure.

FIG. 2 is a plan view showing an example of a pixel sharing structure of the imaging apparatus 100 according to the embodiment of the present disclosure. As shown in FIG. 2, in the imaging apparatus 100, a total of four pixels 102 including, for example, two pixels 102 arranged in a vertical direction and two pixels 102 arranged in a horizontal direction constitute one shared pixel structure. One shared pixel structure includes four photodiodes PD (an example of the "photoelectric conversion portion" according to the present disclosure), four transfer transistors Tr (an example of the "vertical transistors" according to the present disclosure), one shared floating diffusion FD (an example of the "electric field holding portion" according to the present disclosure), one shared selective transistor (not illustrated), one shared reset transistor (not illustrated), and one shared amplifying transistor (not illustrated).

The floating diffusion FD is disposed in a center portion of the four pixels 102 constituting one shared pixel structure. A gate electrode GE of the transfer transistor Tr is disposed in a vicinity of the floating diffusion FD. Each gate electrode GE of the four pixels 102 is disposed so as to surround one floating diffusion FD in a plan view. A pixel separating portion 120 is provided in an outer periphery of each pixel 102. The pixel separating portion 120 is constituted of, for example, an impurity diffused layer of a different conductivity type from the semiconductor substrate 111, a deep trench isolation, or the like.

In FIG. 2, upward in a direction perpendicular to a paper plane represents a side of a surface 101*a* of the semiconductor substrate 111 which is provided with a multilayer wiring layer constituted of a plurality of wiring layers and a plurality of interlayer insulating films (both not illustrated). On the other hand, downward in the direction perpendicular to the paper plane in FIG. 2 represents a rear surface side of the semiconductor substrate 111 which is a light incidence surface into which light is incident and which is provided with an on-chip lens, a color filter, or the like (both not illustrated). The imaging apparatus 100 is a backside illumination CMOS image sensor which photoelectrically converts light incident from the rear surface side of the semiconductor substrate 111.

Figure 3:
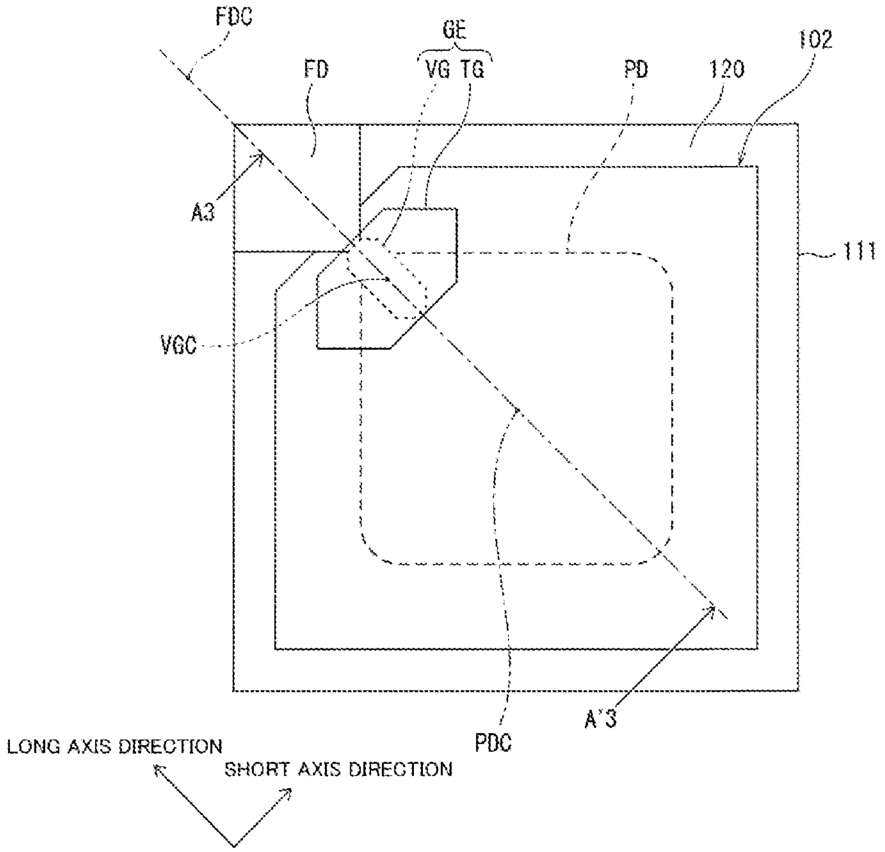
FIG. 3 is a plan view showing a configuration example of a pixel according to the embodiment of the present disclosure.
Figure 4:
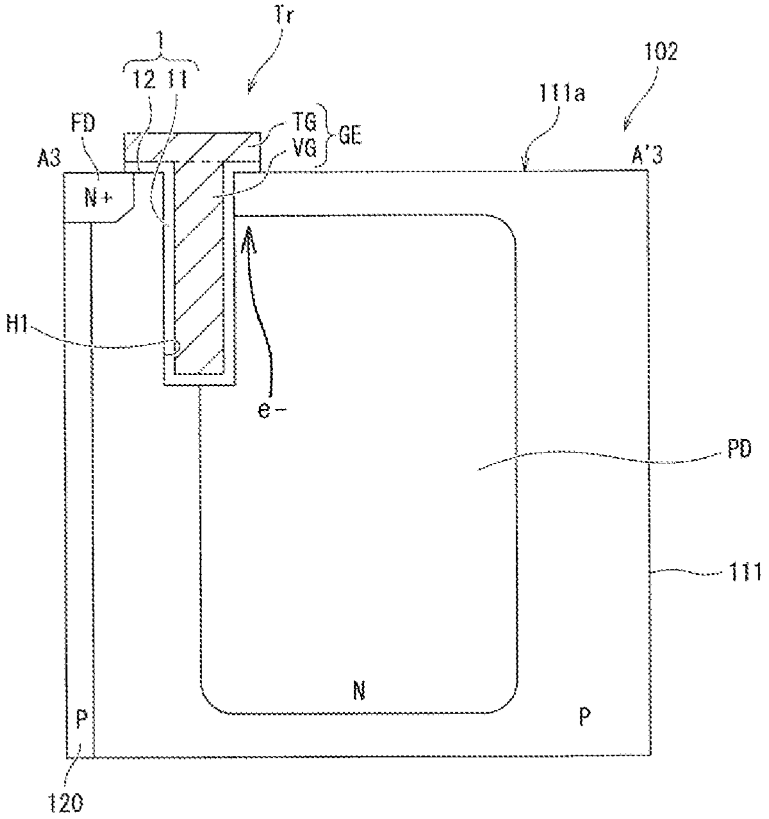
FIG. 4 is a sectional view showing a configuration example of a pixel according to the embodiment of the present disclosure.

FIG. 3 is a plan view showing a configuration example of the pixel 102 according to the embodiment of the present disclosure. FIG. 4 is a sectional view showing the configuration example of the pixel 102 according to the embodiment of the present disclosure. FIG. 4 schematically shows a cross-section taken along line A3-A'3 in FIG. 3. The semiconductor substrate 111 is, for example, a single-crystal silicon substrate or a single-crystal silicon layer formed by an epitaxial growth method on a substrate (not illustrated). As shown in FIG. 4, a conductivity type of the semiconductor substrate 111 is, for example, the P type.

As shown in FIGS. 3 and 4, the photodiode PD is provided inside a P-type semiconductor substrate 111. The photodiode PD is constituted of, for example, an N-type impurity diffused layer. The photodiode PD photoelectrically converts incident light that is incident from the rear surface side of the semiconductor substrate 111 and accumulates an obtained electric charge $e^-$.

The transfer transistor Tr is provided from the inside of the semiconductor substrate 111 to a position on top of the surface 111*a* (an example of the "first principal plane" according to the present disclosure). The transfer transistor Tr is, for example, an N-type vertical transistor which has a gate electrode GE and a gate insulating film 1 provided between the gate electrode GE and the semiconductor substrate 111 and which uses the photodiode PD as a source and the floating diffusion FD as a drain. The transfer transistor Tr transfers the electrical charge $e^-$ from the photodiode PD to the floating diffusion FD.

The floating diffusion FD is provided on the side of the surface 111*a* of the semiconductor substrate 111 and is constituted of, for example, an N-type impurity diffused layer. The floating diffusion FD holds an electrical charge $e^-$ having been transferred from the transfer transistor Tr.

A structure of the transfer transistor Tr will now be described in greater detail. The semiconductor substrate 111 is provided with a hole portion H1 which opens to the side of the surface 111*a* and which is adjacent to the photodiode PD. The gate electrode GE has a first gate electrode VG which is disposed inside the hole portion H1 via the first gate insulating film 11 and which is provided so as to extend in a longitudinal direction (in other words, a thickness direction of the semiconductor substrate 111) and a second gate electrode TG which is provided on a second gate insulating film 12 and which is connected to the first gate electrode VG. The first gate electrode VG and the second gate electrode TG are constituted of, for example, a polysilicon film doped with impurities. Alternatively, the first gate electrode VG and the second gate electrode TG may be constituted of a metal or the like. The first gate electrode VG and the second gate electrode TG are integrally formed.

The gate insulating film 1 has a first gate insulating film 11 which is provided between an inner wall of the hole portion H1 and the first gate electrode VG and a second gate insulating film 12 which is provided on a side of the surface 111*a* of the semiconductor substrate 111 and which is in contact with the first gate insulating film 11. The second gate insulating film 12 is positioned between the surface 111*a* of the semiconductor substrate 111 and the second gate electrode TG. The first gate insulating film 11 and the second gate insulating film 12 are, for example, a silicon dioxide film formed by thermally oxidizing the semiconductor substrate 111. The first gate insulating film 11 and the second gate insulating film 12 are integrally formed.

The electric charge $e^-$ created due to photoelectric conversion by the photodiode PD is transferred in a longitudinal direction (for example, a thickness direction of the semiconductor substrate 111) along the first gate electrode VG of the transfer transistor Tr, subsequently transferred in a horizontal direction (for example, a direction horizontal to the surface 111*a* of the semiconductor substrate 111) along the second gate electrode TG, and reaches the floating diffusion FD. When the electric charge $e^-$ is being transferred from the photodiode PD to the floating diffusion FD, the electric charge $e^-$ moves along a side surface of the first gate electrode VG so as to circumvent the first gate electrode VG.

Although not illustrated, a region which opposes the first gate electrode VG across the first gate insulating film 11 in the semiconductor substrate 111 may be provided with an electric charge transfer channel. In addition, a region which opposes the second gate electrode TG across the second gate insulating film 12 in the semiconductor substrate 111 may also be provided with an electric charge transfer channel. For example, an electric charge transfer channel is constituted of a P-type impurity diffused layer. Providing electric charge transfer channels in the regions described above enables various characteristics (for example, a threshold voltage and an off-state breakdown voltage) of a transfer transistor to be adjusted to desired values.

(Crystallographic Orientation)

The semiconductor substrate 111 shown in FIGS. 2 to 4 is, for example, a silicon substrate. The surface 111*a* of the semiconductor substrate 111 is a surface of which a crystallographic plane is the (100) plane or a plane equivalent to the (100) plane. Examples of planes equivalent to the (100) plane include a (010) plane, a (001) plane, a (−100) plane, a (0-10) plane, and a (00-1) plane. In the present specification, for convenience's sake, a plane equivalent to the (100) plane will be simply referred to as the (100) plane.

A normal direction of a crystallographic plane is a crystallographic orientation. The crystallographic orientation of the (100) plane is a <100> direction. In the present specification, for convenience's sake, not only the crystallographic orientation of the (100) plane but also a crystallographic orientation of a plane equivalent to the (100) plane will be simply referred to as the <100> direction.

The crystallographic orientation <110> direction intersects the <100> direction at an angle of 45 degrees. In the present specification, for convenience's sake, not only the crystallographic orientation of the <110> direction but also a crystallographic orientation equivalent to the <110> direction will be simply referred to as the <110> direction.

Configuration Example of First Gate Electrode

Figure 5:
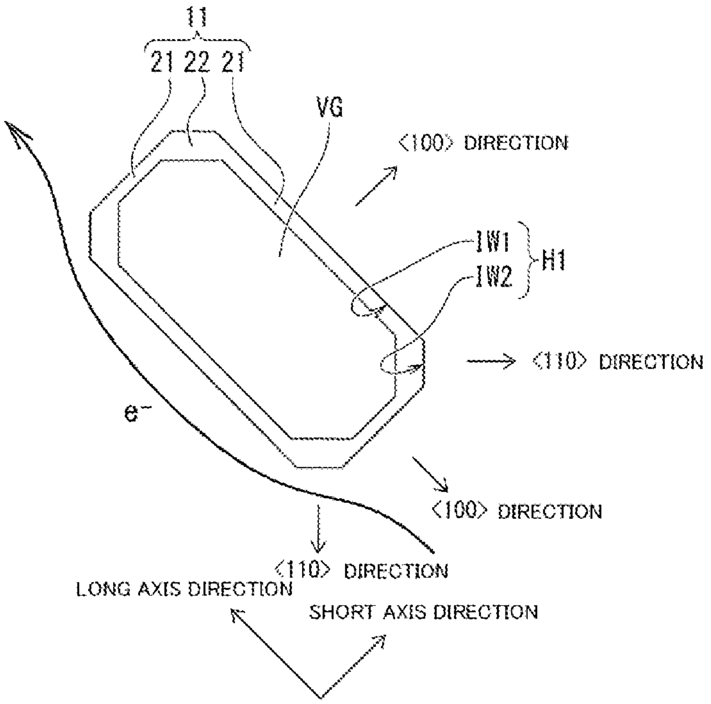
FIG. 5 is a sectional view showing a first configuration example of a first gate electrode and a first gate insulating film according to the embodiment of the present disclosure.

FIG. 5 is a sectional view showing a first configuration example of the first gate electrode VG and the first gate insulating film 11 according to the embodiment of the present disclosure. FIG. 5 shows cross sections of the first gate electrode VG and the first gate insulating film 11 cut along a plane (hereinafter, also referred to as a horizontal plane) that is parallel to the surface 111*a* of the semiconductor substrate 111. As shown in FIG. 5, the cross section (hereinafter, also referred to as a VG cross section) of the first gate electrode VG cut along the horizontal plane has a shape that is elongated in the crystallographic orientation <100> direction of the semiconductor substrate 111. For example, the VG cross section has an octagonal shape that is elongated in the <100> direction in a plan view. One end in a long axis direction of the VG cross section of the first gate electrode VG is positioned on a side of the photodiode PD and another end in the long axis direction of the VG cross section is positioned on a side of the floating diffusion FD. In addition, the one end in the long axis direction of the VG cross section of the first gate electrode VG and the other end in the long axis direction of the VG cross section are respectively positioned under the second gate electrode TG.

An outer periphery of the cross section (hereinafter, also referred to as an insulating film cross section) of the first gate insulating film 11 positioned in the periphery of the first gate electrode VG cut along the horizontal plane also has an octagonal shape that is elongated in the <100> direction in a plan view.

Figure 6:
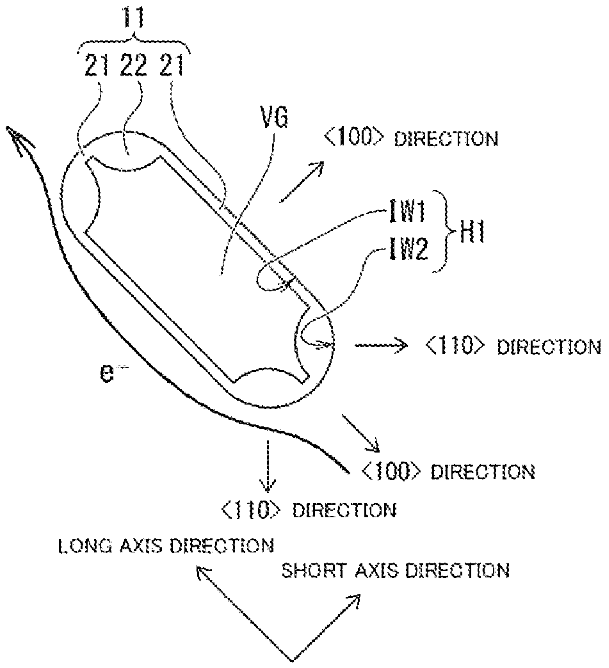
FIG. 6 is a sectional view showing a second configuration example of the first gate electrode and the first gate insulating film according to the embodiment of the present disclosure.

FIG. 6 is a sectional view showing a second configuration example of the first gate electrode VG and the first gate insulating film 11 according to the embodiment of the present disclosure. FIG. 6 shows cross sections of the first gate electrode VG and the first gate insulating film 11 cut along a horizontal plane that is parallel to the surface 111*a* of the semiconductor substrate 111. In the present embodiment, the cross section (the VG cross section) of the first gate electrode VG cut along a horizontal plane need only be elongated in the <100> direction in a plan view. While the VG cross section in FIG. 5 represents a case where each side of the octagon that is elongated in the <100> direction has a linear shape, the present embodiment is not limited thereto. As shown in FIG. 6, in the VG cross section, at least a part of a side facing the <110> direction may be curved so as to be depressed inward in a plan view. In addition, the shape of the VG cross section is not limited to an octagon.

An outer periphery of a cross section (an insulating film cross section) of the first gate insulating film 11 positioned around the first gate electrode VG along a horizontal plane also need only be elongated in the <100> direction in a plan view and is not limited to an octagon. As shown in FIG. 6, the outer periphery of the insulating film cross section may have a shape of an ellipse that is elongated in the <100> direction in a plan view.

In both the first configuration example shown in FIG. 5 and the second configuration example shown in FIG. 6, the first gate insulating film 11 is formed by thermally oxidizing the inner wall of the hole portion H1 (refer to FIG. 4) of the semiconductor substrate 111. The inner wall of the hole portion H1 has a first inner wall IW1 of which a crystallographic plane is the (100) plane and a second inner wall IW2 of which a crystallographic plane is the (110) plane. The first gate insulating film 11 has a first part 21 that is positioned between the first inner wall IW1 and the first gate electrode VG and a second part 22 that is positioned between the second inner wall IW2 and the first gate electrode VG. The first part 21 is formed by thermally oxidizing the first inner wall IW1 of which a crystallographic plane is the (100) plane. The second part 22 is formed by thermally oxidizing the second inner wall IW2 of which a crystallographic plane is the (110) plane.

The second part 22 has a greater film thickness than the first part 21. The difference in film thickness is due to a difference in crystallographic planes of the inner walls that provide a foundation for thermal oxidation. The (110) plane is more readily thermally oxidized than the (100) plane and a thicker oxidized film is more readily formed. For example, the film thickness of the second part 22 is 1.1 times or more and 2.0 times or less thicker than the film thickness of the first part 21. In both FIGS. 5 and 6, the second part 22 is respectively positioned at both ends in a long axis direction of the cross section (VG cross section) of the first gate electrode VG.

Figure 7:
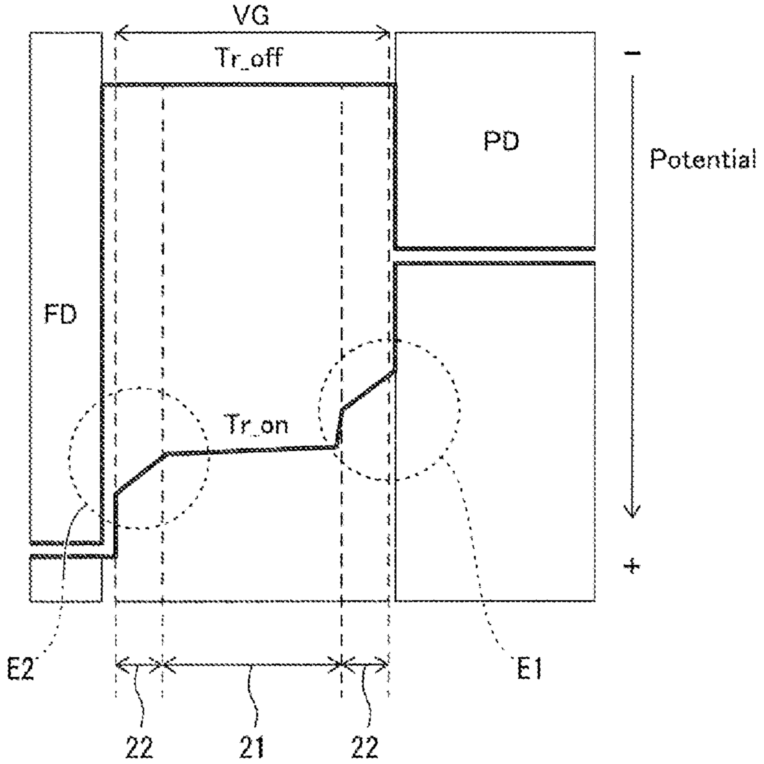
FIG. 7 is a graph schematically showing a potential distribution of a semiconductor substrate in a periphery of the first gate electrode according to the embodiment of the present disclosure.

FIG. 7 is a graph schematically showing a potential distribution of the semiconductor substrate 111 in a periphery of the first gate electrode VG according to the embodiment of the present disclosure. In FIG. 7, Tr_on signifies the presence of a state where a voltage equal to or higher than a threshold voltage is being applied to the first gate electrode VG and the transfer transistor Tr is switched on. Tr_off signifies the presence of a state where the voltage is not being applied to the first gate electrode VG and the transfer transistor Tr is switched off. Furthermore, in FIG. 7, E1 indicates an end (a source terminal) on a side of the photodiode PD of a channel region formed along the first gate electrode VG. In FIG. 7, E2 indicates an end (a drain terminal) on a side of the floating diffusion FD of the channel region formed along the first gate electrode VG.

In a region (hereinafter, also referred to as a thick-film region) in contact with the second part 22 in the semiconductor substrate 111, an inversion layer due to Tr_on is less likely to be formed and a potential barrier is more readily created than in a region (hereinafter, also referred to as a thin-film region) in contact with the first part 21 in the semiconductor substrate. Consequently, an electric charge $e^-$ less readily flows in the thick-film region than in the thin-film region. On the other hand, a gradient of potential is more readily formed and an electric charge $e^-$ more readily flows at the source terminal E1 and the drain terminal E2.

In the embodiment of the present disclosure, giving the VG cross section an elongated shape in the <100> direction enables a thick-film region to be disposed at each position of the source terminal E1 and the drain terminal E2. Accordingly, the transfer transistor Tr can offset and reduce the potential barrier created in the thick-film region by the potential gradient at the source terminal E1 and the drain terminal E2. Accordingly, the transfer transistor Tr can improve transfer efficiency of the electric charge $e^-$.

In the embodiment of the present disclosure, preferably, a central part FDC of the floating diffusion FD, a central part VGC of the VG cross section of the first gate electrode VG cut along a horizontal plane, and a central part PDC of the photodiode PD line up or approximately line up in a straight line when viewed in a normal direction of the surface 111*a* of the semiconductor substrate 111 (in a plan view). Since potential energy of the photodiode PD reaches maximum in the central part PDC of the photodiode PD, the transfer efficiency of the electric charge $e^-$ per unit light intensity can be increased.

In addition, preferably, the straight line connecting the respective central parts FDC, VGC, and PDC described above is parallel to or approximately parallel to the long axis direction of the VG cross section. Accordingly, a ratio of the thin-film region in a transfer path of the electric charge $e^-$ can be increased. Therefore, the transfer transistor Tr can further increase the transfer efficiency of the electric charge $e^-$.

Comparative Example

Figure 8:
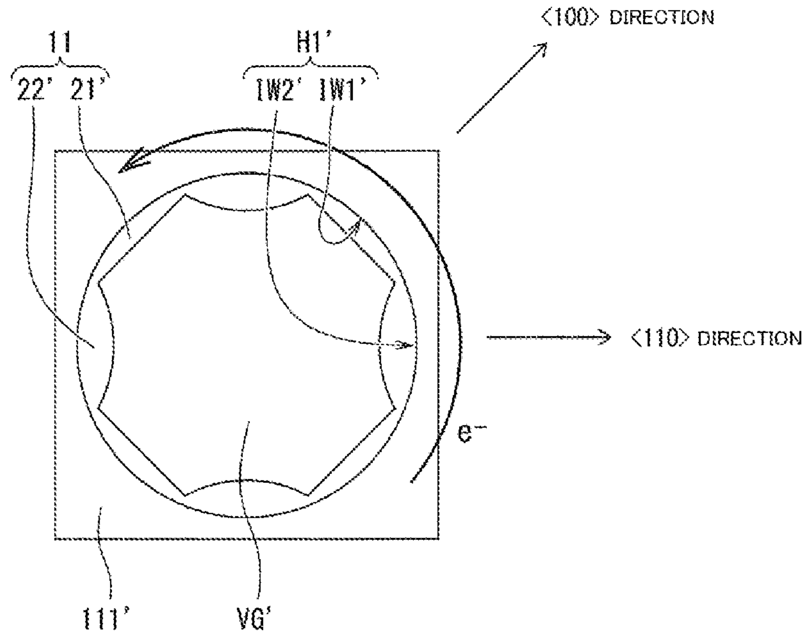
FIG. 8 is a sectional view showing a configuration of a first gate electrode and a first gate insulating film according to a comparative example of the present disclosure.

FIG. 8 is a sectional view showing a configuration of a first gate electrode VG' and a first gate insulating film 11' according to a comparative example of the present disclosure. FIG. 5 shows cross sections of the first gate electrode VG' and the first gate insulating film 11 cut along a horizontal plane that is parallel to a surface of a semiconductor substrate 111'. As shown in FIG. 8, the cross section of the first gate electrode VG' cut along a horizontal plane has a shape similar to an octagon with a reduced bias in one direction. In addition, an outer periphery of a cross section of the first gate insulating film 11' positioned around the first gate electrode VG' along a horizontal plane has a shape similar to a perfect circle.

In the comparative example shown in FIG. 8, the first gate insulating film 11' is formed by thermally oxidizing an inner wall of a hole portion H1' of the semiconductor substrate 111'. The inner wall of the hole portion H1' has a first inner wall IW1' of which a crystallographic plane is the (100) plane and a second inner wall IW2' of which a crystallographic plane is the (110) plane. The first gate insulating film 11' has a first part 21' that is positioned between the first inner wall IW1' and the first gate electrode VG and a second part 22' that is positioned between the second inner wall IW2' and the first gate electrode VG'. A film thickness of the second part 22' is greater than that of the first part 21'. The difference in film thickness is due to a difference in crystallographic planes of the inner walls that provide a foundation for thermal oxidation. The (110) plane is more readily thermally oxidized than the (100) plane and a thicker oxidized film is more readily formed.

Figure 9:
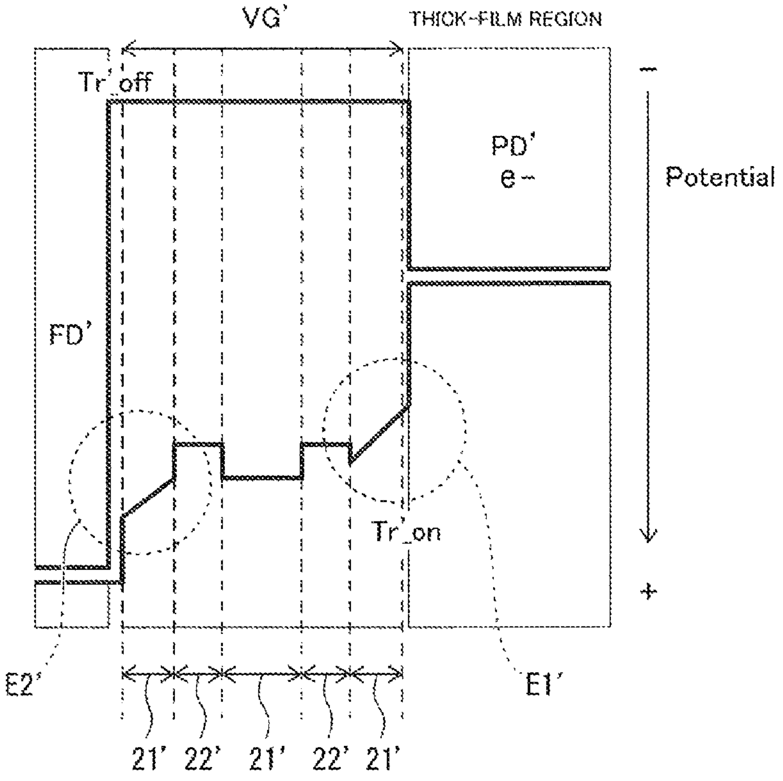
FIG. 9 is a graph schematically showing a potential distribution of a semiconductor substrate in a periphery of the first gate electrode according to the comparative example of the present disclosure.

FIG. 9 is a graph schematically showing a potential distribution of the semiconductor substrate 111' in a periphery of the first gate electrode VG according to the comparative example of the present disclosure. In FIG. 9, Tr'_on signifies the presence of a state where a voltage equal to or higher than a threshold voltage is being applied to the first gate electrode VG' and a transfer transistor is switched on. Tr'_off signifies the presence of a state where the voltage is not being applied to the first gate electrode VG' and the transfer transistor is switched off. Furthermore, in FIG. 9, E1' indicates an end (in other words, a source terminal) on a side of a photodiode PD' of a channel region formed along the first gate electrode VG'. In FIG. 9, E2 indicates an end (in other words, a drain terminal) on a side of a floating diffusion FD' of the channel region formed along the first gate electrode VG'.

In a semiconductor region (a thick-film region) in contact with the second part 22', an inversion layer due to Tr'_on is less likely to be formed than in a semiconductor region (a thin-film region) in contact with the first part 21'. As shown in FIG. 9, in the comparative example, the source terminal E1' and the drain terminal E2' where a gradient of potential is more readily formed and the thick-film region are disposed at positions that differ from each other. In the case shown in FIG. 9, since a potential barrier created in the thick-film region cannot be offset by the potential gradients at the source terminal E1' and the drain terminal E2', an electric charge $e^-$ flows less readily than in the case shown in FIG. 7.

(Advantageous Effect of Embodiment)

As described thus far, the imaging apparatus 100 according to the embodiment of the present disclosure includes the semiconductor substrate 111 and the vertical transfer transistor Tr provided on the semiconductor substrate 111. The semiconductor substrate 111 is provided with the hole portion H1 that opens to a side of the surface 111*a*. The transfer transistor Tr has the first gate electrode VG provided inside the hole portion H1 and a first gate insulating film 11 provided between the inner wall of the hole portion H1 and the first gate electrode VG. A cross section of the first gate electrode VG cut along a horizontal plane that is parallel to the surface 111*a* of the semiconductor substrate 111 has a shape that is elongated in the crystallographic orientation <100> direction of the semiconductor substrate 111.

Accordingly, the (110) plane on which the first gate insulating film 11 is thickly formed among the inner wall of the hole portion H1 is disposed near an end in the long axis direction of the VG cross section. In addition, due to thermal oxidation of the (110) plane, the second part 22 being a thick-film portion of the first gate insulating film 11 is formed near the end in the long axis direction. In the semiconductor substrate 111, a region (a thick-film region) that comes into contact with the second part 22 is respectively disposed at the source terminal E1 and the drain terminal E2 of the transfer transistor Tr. Accordingly, a potential barrier created in the thick-film region can be offset and reduced by each of the potential gradients created at the source terminal E1 and the drain terminal E2. As a result, transfer efficiency of an electric charge $e^-$ by the transfer transistor Tr can be improved.

(First Modification)

Figure 10:
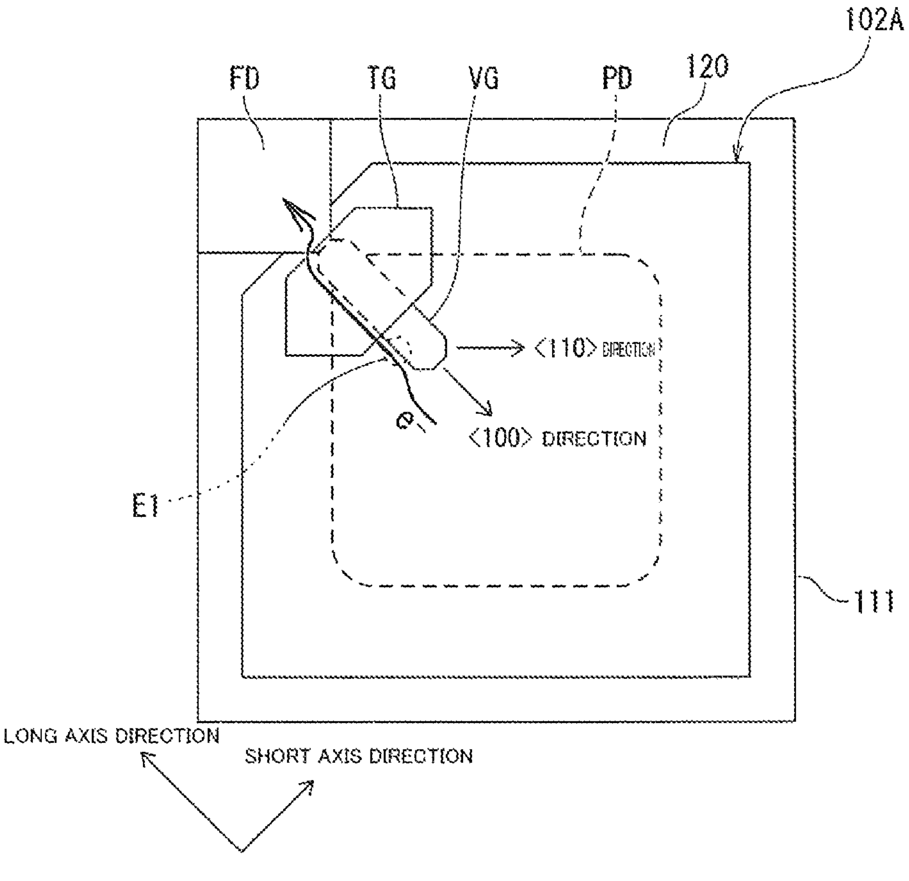
FIG. 10 is a plan view showing a configuration of a pixel according to a first modification of the embodiment of the present disclosure.

FIG. 10 is a plan view showing a configuration of a pixel 102A according to a first modification of the embodiment of the present disclosure. As shown in FIG. 10, in the embodiment of the present disclosure, an end on the side of the photodiode PD among both ends in the long axis direction of the VG cross section of the first gate electrode VG may protrude toward the side of the photodiode PD from under the second gate electrode TG. In this case, a transfer path of the electric charge $e^-$ is directly connected from the photodiode PD to the thin-film region of the transfer transistor Tr without going through the thick-film region. The source terminal E1 of the transfer transistor Tr is disposed in the thin-film region, and the thick-film region on a side of the source (the side of the photodiode PD) deviates from the transfer path of the electric charge $e^-$. Even with such a configuration, the transfer transistor Tr is capable of improving the transfer efficiency of the electric charge $e^-$.

(Second Modification)

Figure 11:
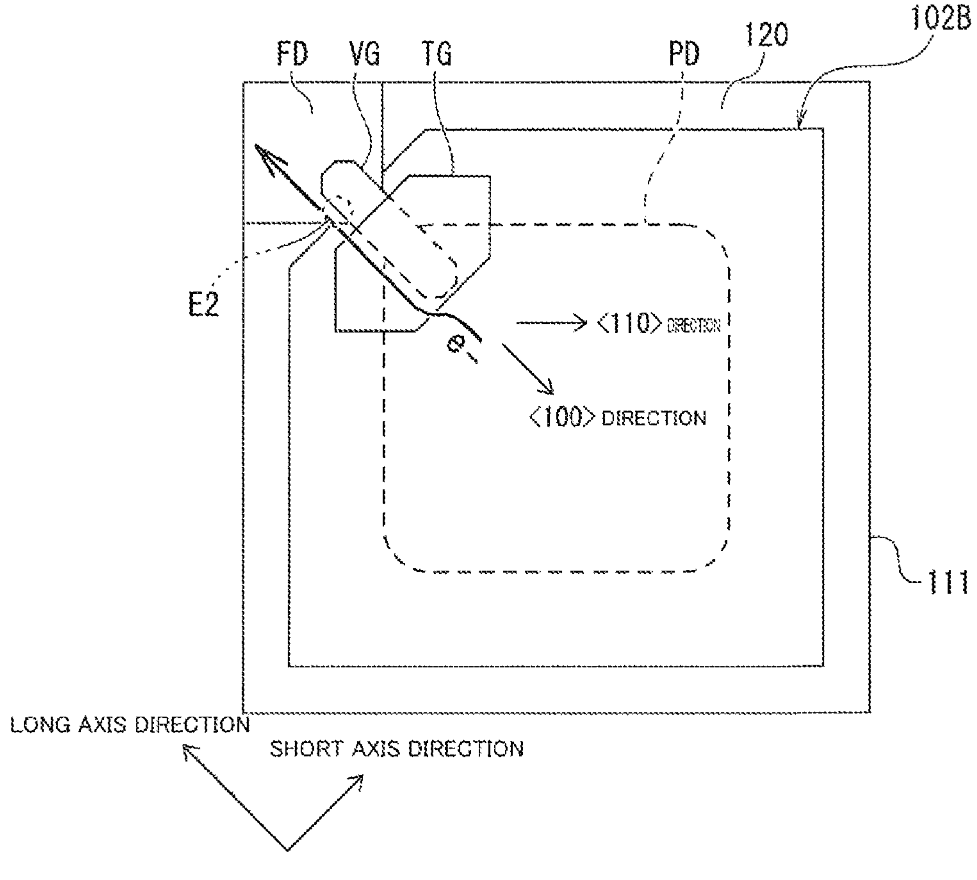
FIG. 11 is a plan view showing a configuration of a pixel according to a second modification of the embodiment of the present disclosure.

FIG. 11 is a plan view showing a configuration of a pixel 102B according to a second modification of the embodiment of the present disclosure. As shown in FIG. 11, in the embodiment of the present disclosure, an end on the side of the floating diffusion FD among both ends in the long axis direction of the VG cross section of the first gate electrode VG may protrude toward the side of the floating diffusion FD from under the second gate electrode TG. In this case, a transfer path of the electric charge $e^-$ is directly connected from the thin-film region of the transfer transistor Tr to the floating diffusion FD without going through the thick-film region. The drain terminal E2 of the transfer transistor Tr is disposed in the thin-film region, and the thick-film region on a side of the drain (the side of the floating diffusion FD) deviates from the transfer path of the electric charge $e^-$. Even with such a configuration, the transfer transistor Tr is capable of improving the transfer efficiency of the electric charge $e^-$.

(Third Modification)

Figure 12:
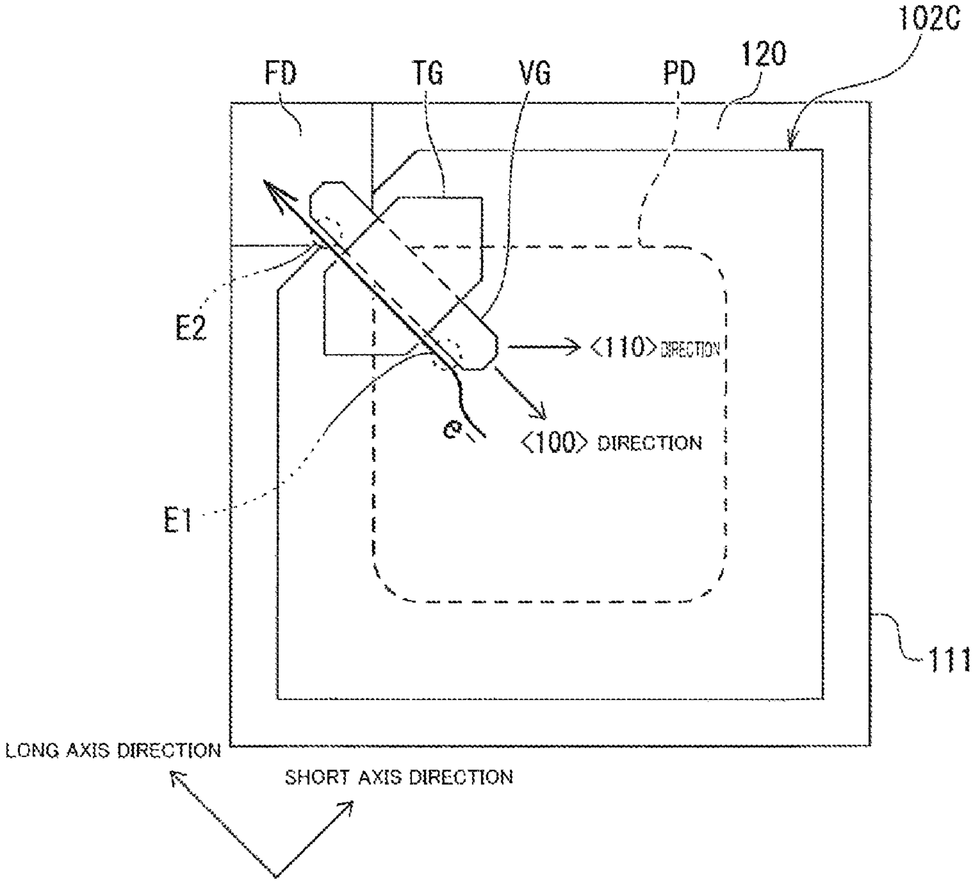
FIG. 12 is a plan view showing a configuration of a pixel according to a third modification of the embodiment of the present disclosure.

FIG. 12 is a plan view showing a configuration of a pixel 102C according to a third modification of the embodiment of the present disclosure. As shown in FIG. 12, in the embodiment of the present disclosure, both ends in the long axis direction of the VG cross section of the first gate electrode VG may respectively protrude from under the second gate electrode TG. The end on the side of the photodiode PD of the VG cross section may protrude toward the side of the photodiode PD from under the second gate electrode TG, and the end on the side of the floating diffusion FD of the VG cross section may protrude toward the side of the floating diffusion FD from under the second gate electrode TG.

In this case, a transfer path of the electric charge $e^-$ is directly connected from the photodiode PD to the thin-film region of the transfer transistor Tr without going through the thick-film region and directly connected from the thin-film region to the floating diffusion FD without going through the thick-film region. The source terminal E1 of the transfer transistor Tr is disposed in the thin-film region, and the thick-film region on a side of the source (the side of the photodiode PD) deviates from the transfer path of the electric charge $e^-$. The drain terminal E2 of the transfer transistor Tr is disposed in the thin-film region, and the thick-film region on a side of the drain (the side of the floating diffusion FD) deviates from the transfer path of the electric charge $e^-$. Even with such a configuration, the transfer transistor Tr is capable of improving the transfer efficiency of the electric charge $e^-$.

(Fourth and Fifth Modifications)

Figure 13:
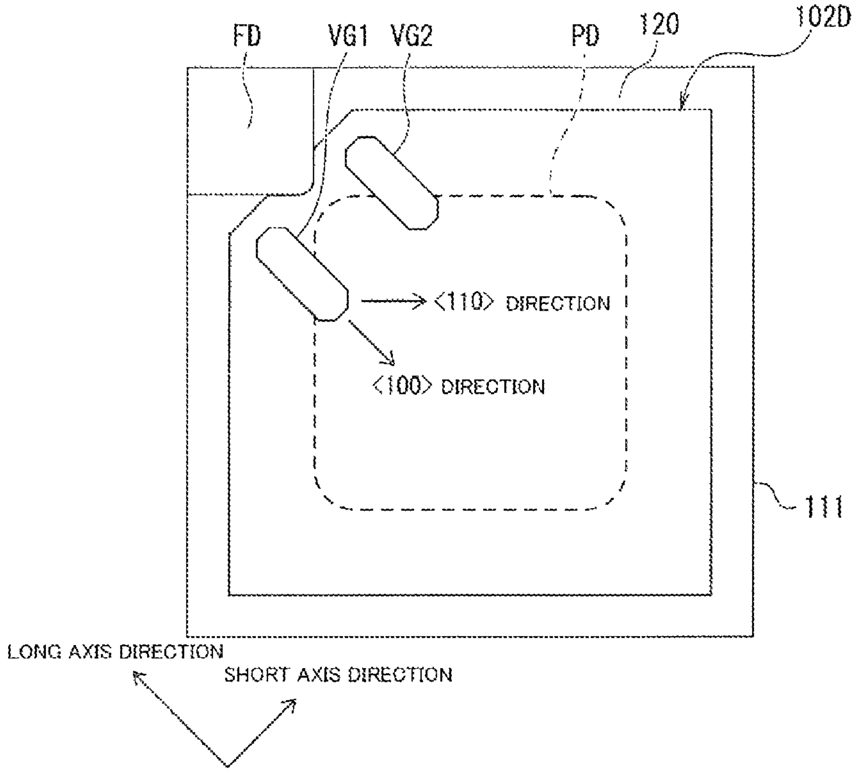
FIG. 13 is a plan view showing a configuration of a pixel according to a fourth modification of the embodiment of the present disclosure.
Figure 14:
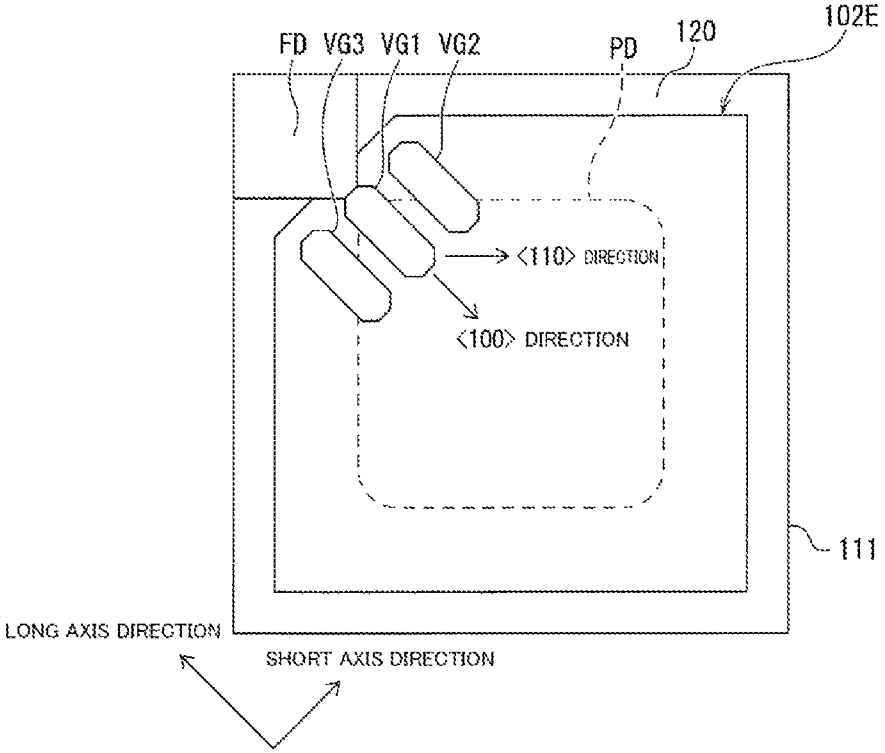
FIG. 14 is a plan view showing a configuration of a pixel according to a fifth modification of the embodiment of the present disclosure.

FIG. 13 is a plan view showing a configuration of a pixel 102D according to a fourth modification of the embodiment of the present disclosure. FIG. 14 is a plan view showing a configuration of a pixel 102E according to a fifth modification of the embodiment of the present disclosure. In FIGS. 13 and 14, the second gate electrode TG is not illustrated. As shown in FIGS. 13 and 14, in the embodiment of the present disclosure, one pixel 102D may be provided with N (where N is an integer equal to or larger than 2)-number of first gate electrodes VG. The N-number of first gate electrodes VG are disposed lined up at intervals in a short axis direction of the VG cross section. The short axis direction refers to a direction perpendicular to the long axis direction in a plan view. FIG. 13 represents a case where N=2 and FIG. 14 represents a case where N=3. With such a configuration, since the larger the number N, the larger the number of transfer paths of the electric charge $e^-$, an on-resistance of the transfer transistor Tr can be reduced.

Other Embodiments

While the present disclosure has been described on the basis of the embodiment and modifications as described above, the descriptions and figures that constitute parts of the present disclosure should not be understood as limiting the present disclosure. Various alternative embodiments, examples, and operable techniques will be apparent to those skilled in the art from the present disclosure. It goes without saying that the technique according to the present disclosure (the present technique) includes various embodiments and the like that have not been described herein.

For example, while it has been described that four pixels 102 constitute one shared pixel structure in the embodiment presented above, the present technique is not limited thereto. In the present technique, the pixels 102 need not constitute a shared pixel structure. Specifically, one pixel 102 may be constituted of one photodiode, one transfer transistor, one floating diffusion, one reset transistor, and one amplifying transistor or one pixel 102 may be constituted of one selective transistor in addition to the elements described above. In a similar manner, each of the pixels 102A, 102B, 102C, 102D, and 102E need not constitute a shared pixel structure. As described above, the present technique enables at least one of various omissions, substitutions, and modifications of constituent elements to be performed without departing from the gist of the embodiment described above. Furthermore, the advantageous effects described in the present specification are merely exemplary and not intended as limiting, and other advantageous effects may be produced.

<Application to Electronic Device>

For example, the technique according to the present disclosure (the present technique) can be applied to various electronic devices including an imaging system such as a digital still camera, a digital video camera, or the like (hereinafter collectively referred to as a camera), a mobile device such as a mobile phone having an imaging function, or other devices having an imaging function.

Figure 15:
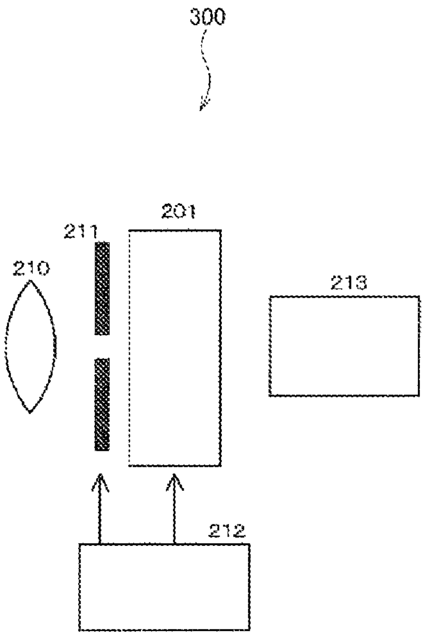
FIG. 15 is a conceptual diagram showing an example in which the technique according to the present disclosure (the present technique) is applied to an electronic device.

FIG. 15 is a conceptual diagram showing an example in which the technique according to the present disclosure (the present technique) is applied to an electronic device 300. As shown in FIG. 15, the electronic device 300 is, for example, a camera and has a solid-state imaging apparatus 201, an optical lens 210, a shutter apparatus 211, a drive circuit 212, and a signal processing circuit 213. The optical lens 210 is an example of the "optical component" of the present disclosure.

Light transmitted through the optical lens 210 is incident to the solid-state imaging apparatus 201. For example, the optical lens 210 forms an image of image light (incident light) from a subject on an imaging surface of the solid-state imaging apparatus 201. Thus, signal charges are accumulated in the solid-state imaging apparatus 201 for a certain period of time. The shutter apparatus 211 controls a light irradiation period and a light blocking period for the solid-state imaging apparatus 201. The drive circuit 212 supplies a drive signal for controlling a transfer operation or the like of the solid-state imaging apparatus 201 and a shutter operation of the shutter apparatus 211. Signal transfer of the solid-state imaging apparatus 201 is performed according to the drive signal (timing signal) supplied from the drive circuit 212. The signal processing circuit 213 performs various kinds of signal processing. For example, the signal processing circuit 213 processes a signal output from the solid-state imaging apparatus 201. A video signal that has undergone signal processing is stored in a storage medium such as a memory or output to a monitor.

It should be noted that the shutter operation in the electronic device 300 may be realized by an electronic shutter (for example, a global shutter) operated by the solid-state imaging apparatus 201 instead of a mechanical shutter. In a case where the shutter operation in the electronic device 300 is realized by the electronic shutter, the shutter apparatus 211 shown in FIG. 15 may be omitted.

In the electronic device 300, the imaging apparatus 100 described above is applied to the solid-state imaging apparatus 201. Thus, the electronic device 300 with improved performance can be obtained. It should be noted that the electronic device 300 is not limited to a camera. The electronic device 300 may be a mobile device such as a mobile phone having an imaging function or other devices having an imaging function.

<Application to Endoscopic Surgery System>

The technique according to the present disclosure (the present technique) can be applied to various products. For example, the technique according to the present disclosure may be applied to an endoscopic surgery system.

Figure 16:
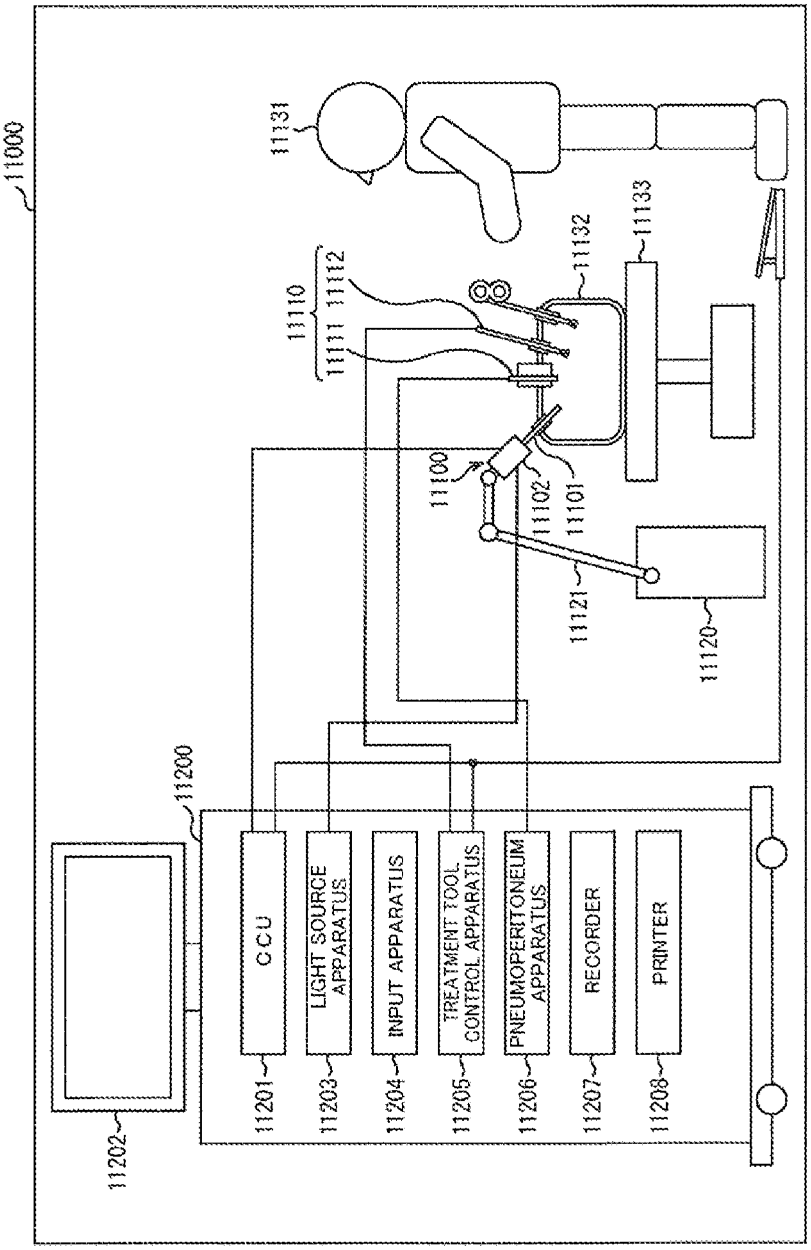
FIG. 16 is a diagram showing an example of a schematic configuration of an endoscopic surgery system to which the technique according to the present disclosure (the present technique) may be applied.

FIG. 16 is a diagram showing an example of a schematic configuration of an endoscopic surgery system to which the technique according to the present disclosure (the present technique) is applied.

FIG. 16 shows a state where an operator (doctor) 11131 is using an endoscopic surgery system 11000 to perform a surgical operation on a patient 11132 on a patient bed 11133. As illustrated, the endoscopic surgery system 11000 is constituted of an endoscope 11100, another surgical instrument 11110 such as a pneumoperitoneum tube 11111 or an energized treatment tool 11112, a support arm apparatus 11120 that supports the endoscope 11100, and a cart 11200 mounted with various apparatuses for endoscopic surgery.

The endoscope 11100 includes a lens barrel 11101 of which a region with a predetermined length from a distal end is inserted into a body cavity of the patient 11132 and a camera head 11102 connected to a base end of the lens barrel 11101. While the illustrated example shows the endoscope 11100 configured as a so-called rigid scope having a rigid lens barrel 11101, alternatively, the endoscope 11100 may be configured as a so-called flexible scope having a flexible lens barrel.

The distal end of the lens barrel 11101 is provided with an opening into which an objective lens is fitted. A light source apparatus 11203 is connected to the endoscope 11100, light generated by the light source apparatus 11203 is guided to the distal end of the lens barrel 11101 by a light guide extended to the inside of the lens barrel 11101, and the light is radiated toward an observation target in the body cavity of the patient 11132 through the objective lens. The endoscope 11100 may be a direct-viewing endoscope, an oblique-viewing endoscope, or a side-viewing endoscope.

An optical system and an imaging element are provided inside the camera head 11102 and light (observation light) reflected from the observation target is condensed on the imaging element by the optical system. The observation light is photoelectrically converted by the imaging element and an electric signal corresponding to the observation light, that is, an image signal corresponding to an observation image, is generated. The image signal is transmitted as RAW data to a camera control unit (CCU) 11201.

The CCU 11201 is constituted of a central processing unit (CPU), a graphics processing unit (GPU), or the like, and comprehensively controls operations of the endoscope 11100 and a display apparatus 11202. Further, the CCU 11201 receives the image signal from the camera head 11102 and performs various types of image processing for displaying an image based on the image signal, for example, development processing (demosaic processing) and the like, on the image signal.

The display apparatus 11202 displays an image based on an image signal having been subjected to image processing by the CCU 11201 under the control of the CCU 11201.

The light source apparatus 11203 is constituted of, for example, a light source such as an LED (Light Emitting Diode) and supplies the endoscope 11100 with irradiation light when photographing a surgical site or the like.

An input apparatus 11204 is an input interface for the endoscopic surgery system 11000. A user can input various kinds of information or instructions to the endoscopic surgery system 11000 through the input apparatus 11204. For example, the user inputs an instruction or the like to change imaging conditions (a kind of irradiation light, a magnification, a focal distance, and the like) for the endoscope 11100.

A treatment tool control apparatus 11205 controls driving of the energized treatment tool 11112 for tissue cautery or incision, blood vessel sealing, or the like. A pneumoperitoneum apparatus 11206 sends a gas into the body cavity of the patient 11132 via the pneumoperitoneum tube 11111 to inflate the body cavity in order to secure a visual field for the endoscope 11100 and to secure a working space of the operator. A recorder 11207 is an apparatus capable of recording various kinds of information regarding surgery. A printer 11208 is an apparatus capable of printing various kinds of information regarding surgery in various forms including text, images, and graphs.

The light source apparatus 11203 that supplies the endoscope 11100 with irradiation light when photographing a surgical site can be constituted of, for example, an LED, a laser light source, or a white light source constituted of a combination thereof. When the white light source is constituted of a combination of RGB laser light sources, since an output intensity and an output timing of each color (each wavelength) can be controlled with high accuracy, the light source apparatus 11203 can adjust white balance of a captured image. In addition, in this case, by irradiating an observation target with laser light from each of the RGB laser light sources in a time-shared manner and controlling driving of the imaging element of the camera head 11102 in synchronization with the irradiation timing, it is also possible to capture images respectively corresponding to RGB in a time-shared manner. According to this method, it is possible to obtain a color image even when color filters are not provided in the imaging element.

The driving of the light source apparatus 11203 may be controlled such that the intensity of light to be output is changed at each predetermined time. By controlling the driving of the imaging element of the camera head 11102 in synchronization with a change timing of the intensity of the light, acquiring images in a time-shared manner, and combining the images, it is possible to generate an image with a high dynamic range in which there is no so-called blocked-up shadows and blown-out highlights.

In addition, the light source apparatus 11203 may be configured to be able to supply light with a predetermined wavelength band corresponding to special light observation. In special light observation, for example, by emitting light in a band narrower than that of irradiation light (that is, white light) during normal observation using wavelength dependence of light absorption in a body tissue, so-called narrow band light observation (narrow band imaging) in which a predetermined tissue such as a blood vessel in the mucous membrane surface layer is imaged with a high contrast is performed. Alternatively, in special light observation, fluorescence observation in which an image is obtained by fluorescence generated by emitting excitation light may be performed. The fluorescence observation can be performed by emitting excitation light toward a body tissue and observing fluorescence from the body tissue (autofluorescence observation), or locally injecting a reagent such as indocyanine green (ICG) to a body tissue and emitting excitation light corresponding to a fluorescence wavelength of the reagent to the body tissue to obtain a fluorescence image. The light source apparatus 11203 may be configured to be able to supply narrow band light and/or excitation light corresponding to such special light observation.

Figure 17:
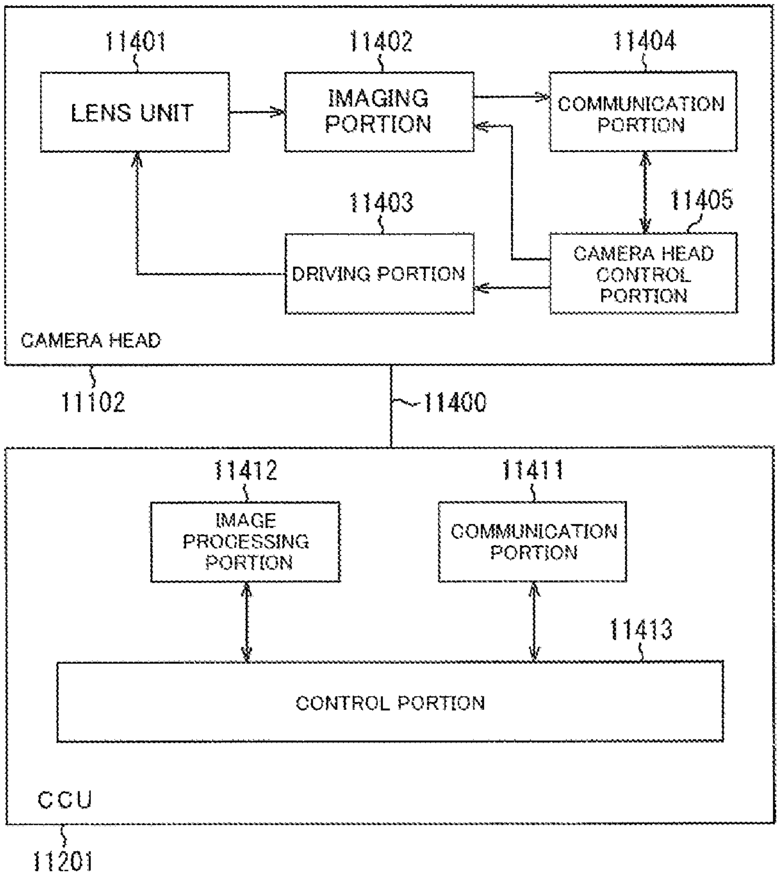
FIG. 17 is a block diagram showing an example of a functional configuration of a camera head and a CCU shown in FIG. 16.

FIG. 17 is a block diagram showing an example of functional configurations of the camera head 11102 and the CCU 11201 shown in FIG. 16.

The camera head 11102 has a lens unit 11401, an imaging portion 11402, a driving portion 11403, a communication portion 11404, and a camera head control portion 11405. The CCU 11201 includes a communication portion 11411, an image processing portion 11412, and a control portion 11413. The camera head 11102 and the CCU 11201 are connected to be able to communicate with each other via a transmission cable 11400.

The lens unit 11401 is an optical system provided in a connecting portion with the lens barrel 11101. Observation light received from the distal end of the lens barrel 11101 is guided to the camera head 11102 and is incident on the lens unit 11401. The lens unit 11401 is constituted of a combination of a plurality of lenses including a zoom lens and a focus lens.

The imaging portion 11402 is constituted of an imaging element. The imaging element constituting the imaging portion 11402 may be one element (a so-called single plate type element) or a plurality of elements (a so-called multi-plate type element). When the imaging portion 11402 is constituted of a multi-plate type element, for example, an image signal corresponding to each of RGB is generated by each of the imaging elements, and a color image may be obtained by combining the image signals. Alternatively, the imaging portion 11402 may be configured to include a pair of imaging elements for respectively acquiring image signals for the right eye and the left eye corresponding to three-dimensional (3D) display. By performing 3D display, the operator 11131 can more accurately ascertain a depth of biological tissues in a surgical site. When the imaging portion 11402 is constituted of a multi-plate type element, a plurality of lens units 11401 may be provided so as to correspond to the respective imaging elements.

The imaging portion 11402 need not necessarily be provided in the camera head 11102. For example, the imaging portion 11402 may be provided immediately after the objective lens inside the lens barrel 11101.

The driving portion 11403 is constituted of an actuator and the zoom lens and the focus lens of the lens unit 11401 are moved by a predetermined distance along an optical axis under the control of the camera head control portion 11405. In this way, it is possible to appropriately adjust a magnification and a focus of a captured image by the imaging portion 11402.

The communication portion 11404 is constituted of a communication apparatus for transmitting or receiving various information to or from the CCU 11201. The communication portion 11404 transmits an image signal obtained from the imaging portion 11402 to the CCU 11201 as raw data via the transmission cable 11400.

The communication portion 11404 receives a control signal for controlling driving of the camera head 11102 from the CCU 11201 and supplies the camera head control portion 11405 with the control signal. The control signal includes, for example, information regarding imaging conditions such as information indicating designation of a frame rate of a captured image, information indicating designation of an exposure value at the time of imaging, and/or information indicating designation of a magnification and a focus of the captured image.

Imaging conditions such as the foregoing frame rate, exposure value, magnification, and focus may be designated appropriately by the user or may be set automatically by the control portion 11413 of the CCU 11201 based on the acquired image signal. In the latter case, the endoscope 11100 is to be equipped with a so-called AE (Auto Exposure) function, AF (Auto Focus) function, and AWB (Auto White Balance) function.

The camera head control portion 11405 controls the driving of the camera head 11102 on the basis of the control signal from the CCU 11201 received via the communication portion 11404.

The communication portion 11411 is constituted of a communication apparatus that transmits and receives various kinds of information to and from the camera head 11102. The communication portion 11411 receives an image signal transmitted via the transmission cable 11400 from the camera head 11102.

In addition, the communication portion 11411 transmits a control signal for controlling the driving of the camera head 11102 to the camera head 11102. The image signal or the control signal can be transmitted through electric communication, optical communication, or the like.

The image processing portion 11412 applies various kinds of image processing to the image signal which is raw data transmitted from the camera head 11102.

The control portion 11413 performs various kinds of control on imaging of a surgical site by the endoscope 11100, display of a captured image obtained through imaging of a surgical site, or the like. For example, the control portion 11413 generates a control signal for controlling driving of the camera head 11102.

In addition, the control portion 11413 causes the display apparatus 11202 to display a captured image showing a surgical site or the like based on an image signal subjected to the image processing by the image processing portion 11412. In doing so, the control portion 11413 may recognize various objects in the captured image using various image recognition techniques. For example, the control portion 11413 can recognize a surgical instrument such as forceps, a specific biological site, bleeding, mist or the like at the time of use of the energized treatment tool 11112, or the like by detecting a shape, a color, or the like of an edge of an object included in the captured image. When the display apparatus 11202 is caused to display a captured image, the control portion 11413 may superimpose various kinds of surgery support information on an image of the surgical site for display using a recognition result of the captured image. By superimposing and displaying the surgery support information and presenting the surgery support information to the operator 11131, it is possible to reduce a burden on the operator 11131 or allow the operator 11131 to perform an operation reliably.

The transmission cable 11400 connecting the camera head 11102 and the CCU 11201 to each other is an electric signal cable that supports electric signal communication, an optical fiber that supports optical communication, or a composite cable thereof.

Here, while communication is performed in a wired manner using the transmission cable 11400 in the illustrated example, alternatively, communication between the camera head 11102 and the CCU 11201 may be performed in a wireless manner.

An example of the endoscopic surgery system to which the technique according to the present disclosure can be applied has been described above. The technique according to the present disclosure may be applied to, for example, the endoscope 11100, the imaging portion 11402 of the camera head 11102, the image processing portion 11412 of the CCU 11201, and the like among the components described above. Specifically, the imaging apparatus 100 described earlier can be applied to the imaging portion 10402. Since applying the technique according to the present disclosure to the endoscope 11100, the imaging portion 11402 of the camera head 11102, the image processing portion 11412 of the CCU 11201, and the like enables a clearer image of a surgical site to be obtained, an operator can reliably confirm the surgical site. Further, since applying the technique according to the present disclosure to the endoscope 11100, the imaging portion 11402 of the camera head 11102, the image processing portion 11412 of the CCU 11201, and the like enables an image of the surgical site to be obtained with lower latency, it is possible to perform a treatment with the same feeling as when the operator is observing the surgical site by touch.

Here, although the endoscopic surgery system has been described as an example, the technique according to the present disclosure may otherwise be applied to a microscopic surgery system or the like.

<Application to Mobile Object>

The technique according to the present disclosure (the present technique) can be applied to various products. For example, the technique according to the present disclosure may be implemented as an apparatus mounted to any type of mobile object such as an automobile, an electric automobile, a hybrid electric automobile, a motorbike, a bicycle, a personal mobility, an airplane, a drone, a ship, and a robot.

Figure 18:
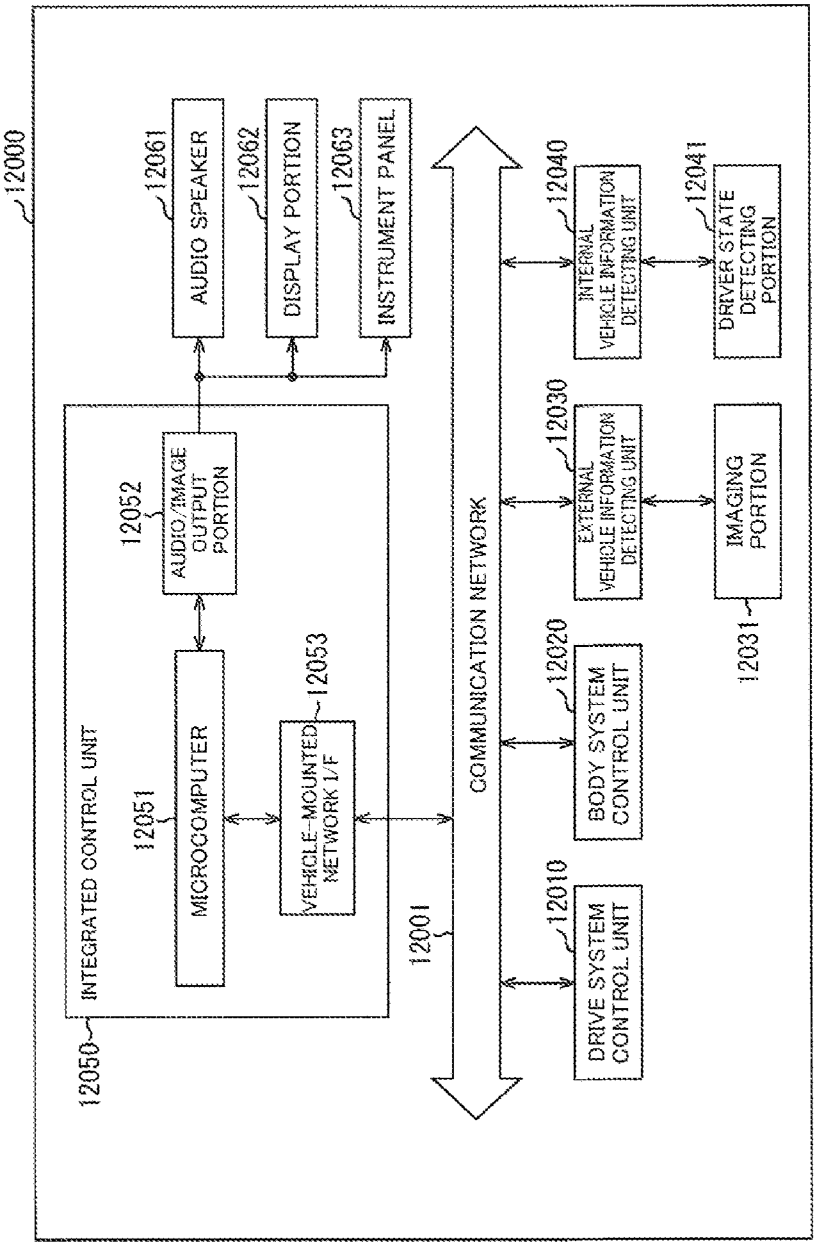
FIG. 18 is a block diagram showing a schematic configuration example of a vehicle control system that is an example of a mobile object control system to which the technique according to the present disclosure may be applied.

FIG. 18 is a block diagram showing a schematic configuration example of a vehicle control system that is an example of a moving body control system to which the technique according to the present disclosure can be applied.

A vehicle control system 12000 includes a plurality of electronic control units connected to each other via a communication network 12001. In an example shown in FIG. 18, the vehicle control system 12000 includes a drive system control unit 12010, a body system control unit 12020, an external vehicle information detecting unit 12030, an internal vehicle information detecting unit 12040, and an integrated control unit 12050. In addition, as functional components of the integrated control unit 12050, a microcomputer 12051, an audio/image output portion 12052, and a vehicle-mounted network I/F (interface) 12053 are shown in the drawing.

The drive system control unit 12010 controls an operation of an apparatus related to a drive system of a vehicle according to various programs. For example, the drive system control unit 12010 functions as a driving force generator for generating a driving force of a vehicle such as an internal combustion engine or a driving motor, a driving force transmission mechanism for transmitting a driving force to wheels, a steering mechanism for adjusting a turning angle of a vehicle, and a control apparatus such as a braking apparatus that generates a braking force of a vehicle.

The body system control unit 12020 controls operations of various apparatuses equipped in a vehicle body in accordance with various programs. For example, the body system control unit 12020 functions as a control apparatus of a keyless entry system, a smart key system, or a power window apparatus, or various lamps such as a head lamp, a back lamp, a brake lamp, a turn signal, or a fog lamp. In this case, radio waves transmitted from a portable device that substitutes for a key or signals of various switches can be input to the body system control unit 12020. The body system control unit 12020 receives inputs of these radio waves or signals and controls a door lock apparatus, a power window apparatus, a lamp, or the like of the vehicle.

The external vehicle information detecting unit 12030 detects information on the outside of the vehicle having the vehicle control system 12000 mounted thereon. For example, an imaging portion 12031 is connected to the external vehicle information detecting unit 12030. The external vehicle information detecting unit 12030 causes the imaging portion 12031 to capture an image of the outside of the vehicle and receives the captured image. The external vehicle information detecting unit 12030 may perform object detection processing or distance detection processing for people, cars, obstacles, signs, or letters on a road on the basis of the received image.

The imaging portion 12031 is an optical sensor that receives light and outputs an electrical signal according to an amount of received light. The imaging portion 12031 can also output the electrical signal as an image or output the electrical signal as ranging information. In addition, light received by the imaging portion 12031 may be visible light or invisible light such as infrared light.

The internal vehicle information detecting unit 12040 detects information of the inside of the vehicle. For example, a driver state detecting portion 12041 that detects a state of a driver is connected to the internal vehicle information detecting unit 12040. The driver state detecting portion 12041 includes, for example, a camera that captures an image of the driver, and the internal vehicle information detecting unit 12040 may calculate a degree of fatigue or a degree of concentration of the driver or may determine whether or not the driver is dozing on the basis of detection information input from the driver state detecting portion 12041.

The microcomputer 12051 can calculate a control target value of the driving force generation apparatus, the steering mechanism, or the braking apparatus on the basis of information of the inside or the outside of the vehicle acquired by the external vehicle information detecting unit 12030 or the internal vehicle information detecting unit 12040, and output a control command to the drive system control unit 12010. For example, the microcomputer 12051 can perform cooperative control for the purpose of realizing functions of an ADAS (advanced driver assistance system) including vehicle collision avoidance, impact mitigation, following traveling based on an inter-vehicle distance, vehicle speed maintenance driving, vehicle collision warning, vehicle lane deviation warning, and the like.

Further, the microcomputer 12051 can perform cooperative control for the purpose of automated driving or the like in which automated travel is performed without depending on operations of the driver by controlling the driving force generator, the steering mechanism, the braking apparatus, or the like on the basis of information regarding the surroundings of the vehicle acquired by the external vehicle information detecting unit 12030 or the internal vehicle information detecting unit 12040.

In addition, the microcomputer 12051 can output a control command to the body system control unit 12020 based on the information on the outside of the vehicle acquired by the external vehicle information detecting unit 12030. For example, the microcomputer 12051 can perform cooperative control for the purpose of preventing glare by controlling the headlamp according to the position of a preceding vehicle or an oncoming vehicle detected by the external vehicle information detecting unit 12030 to switch from a high beam to a low beam or the like.

The audio/image output portion 12052 transmits an output signal of at least one of audio and an image to an output apparatus capable of visually or audibly notifying a passenger inside the vehicle or notifying the outside of the vehicle of information. In the example shown in FIG. 18, as such an output apparatus, an audio speaker 12061, a display portion 12062, and an instrument panel 12063 are shown. The display portion 12062 may include, for example, at least one of an onboard display and a head-up display.

Figure 19:
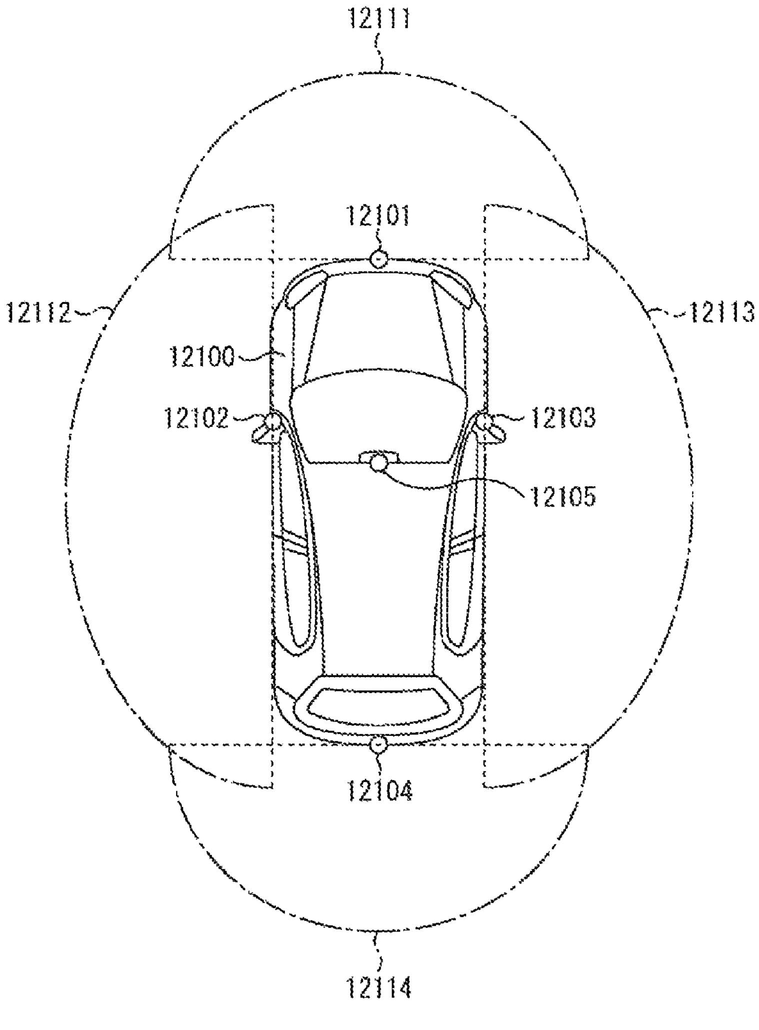
FIG. 19 is a diagram showing an example of an installation position of an imaging portion.

FIG. 19 is a diagram showing an example of an installation position of the imaging portion 12031.

In FIG. 19, a vehicle 12100 includes imaging portions 12101, 12102, 12103, 12104, and 12105 as the imaging portion 12031.

The imaging portions 12101, 12102, 12103, 12104, and 12105 are provided at positions such as a front nose, side-view mirrors, a rear bumper, a back door, and an upper portion of a windshield in a vehicle interior of the vehicle 12100, for example. The imaging portion 12101 provided on the front nose and the imaging portion 12105 provided in the upper portion of the windshield in the vehicle interior mainly acquire images of the front of the vehicle 12100. The imaging portions 12102 and 12103 provided on the side-view mirrors mainly acquire images of a lateral side of the vehicle 12100. The imaging portion 12104 provided on the rear bumper or the back door mainly acquires images of the rear of the vehicle 12100. Front view images acquired by the imaging portions 12101 and 12105 are mainly used for detection of preceding vehicles, pedestrians, obstacles, traffic lights, traffic signs, lanes, and the like.

Also, FIG. 19 shows an example of imaging ranges of the imaging portions 12101 to 12104. An imaging range 12111 indicates an imaging range of the imaging portion 12101 provided at the front nose, imaging ranges 12112 and 12113 respectively indicate imaging ranges of the imaging portions 12102 and 12103 provided at the side-view mirrors, and an imaging range 12114 indicates an imaging range of the imaging portion 12104 provided at the rear bumper or the back door. For example, a bird's-eye view image of the vehicle 12100 as viewed from above can be obtained by superimposing pieces of image data captured by the imaging portions 12101 to 12104.

At least one of the imaging portions 12101 to 12104 may have a function for acquiring distance information. For example, at least one of the imaging portions 12101 to 12104 may be a stereo camera constituted of a plurality of imaging elements or may be an imaging element having pixels for phase difference detection.

For example, the microcomputer 12051 can extract, particularly, a closest three-dimensional object on a path on which the vehicle 12100 is traveling, which is a three-dimensional object traveling at a predetermined speed (for example, 0 km/h or higher) in the substantially same direction as the vehicle 12100, as a preceding vehicle by acquiring a distance to each of the three-dimensional objects in the imaging ranges 12111 to 12114 and a temporal change in the distance (a relative speed with respect to the vehicle 12100) on the basis of distance information obtained from the imaging portions 12101 to 12104. Further, the microcomputer 12051 can set an inter-vehicle distance to be secured in advance in front of a preceding vehicle and can perform automated brake control (also including following stop control), automated acceleration control (also including following start control), and the like. Thus, it is possible to perform cooperative control for the purpose of, for example, automated driving in which the vehicle travels in an automated manner without requiring the driver to perform operations.

For example, the microcomputer 12051 can classify and extract three-dimensional data regarding three-dimensional objects into two-wheeled vehicles, normal vehicles, large vehicles, pedestrians, and other three-dimensional objects such as electric poles based on distance information obtained from the imaging portions 12101 to 12104 and can use the three-dimensional data to perform automated avoidance of obstacles. For example, the microcomputer 12051 differentiates surrounding obstacles of the vehicle 12100 into obstacles which can be viewed by the driver of the vehicle 12100 and obstacles which are difficult to view. Then, the microcomputer 12051 determines a collision risk indicating the degree of risk of collision with each obstacle, and when the collision risk is equal to or higher than a set value and there is a possibility of collision, an alarm is output to the driver through the audio speaker 12061 or the display portion 12062, forced deceleration or avoidance steering is performed through the drive system control unit 12010, and thus it is possible to perform driving support for collision avoidance.

At least one of the imaging portions 12101 to 12104 may be an infrared camera that detects infrared rays. For example, the microcomputer 12051 can recognize a pedestrian by determining whether there is a pedestrian in the captured image of the imaging portions 12101 to 12104. Such pedestrian recognition is performed by, for example, a procedure in which feature points in the captured images of the imaging portions 12101 to 12104 as infrared cameras are extracted and a procedure in which pattern matching processing is performed on a series of feature points indicating an outline of an object to determine whether or not the object is a pedestrian. When the microcomputer 12051 determines that there is a pedestrian in the captured images of the imaging portions 12101 to 12104 and the pedestrian is recognized, the audio/image output portion 12052 controls the display portion 12062 so that a square contour line for emphasis is superimposed and displayed with the recognized pedestrian. In addition, the audio/image output portion 12052 may control the display portion 12062 so that an icon indicating a pedestrian or the like is displayed at a desired position.

An example of the vehicle control system to which the technique according to the present disclosure can be applied has been described above. The technique according to the present disclosure may be applied to the imaging portion 12031 and the like among the above-described configurations. Specifically, the imaging apparatus 100 described earlier can be applied to the imaging portion 12031. By applying the technique according to the present disclosure to the imaging portion 12031, a clearer captured image can be obtained, and thus it is possible to reduce a driver's fatigue.

The present disclosure can also be configured as follows.

(1) An imaging apparatus including:

a semiconductor substrate; and a vertical transistor provided on the semiconductor substrate, wherein the semiconductor substrate is provided with a hole portion that opens on a side of a first principal plane, the vertical transistor has:

a first gate electrode provided inside the hole portion; and a first gate insulating film provided between an inner wall of the hole portion and the first gate electrode, and a cross section of the first gate electrode cut along a plane parallel to the first principal plane has a shape being elongated in a direction of a crystallographic orientation <100> of the semiconductor substrate.

(2) The imaging apparatus according to (1), wherein the inner wall has:

a first inner wall of which a crystallographic plane is a (100) plane; and a second inner wall of which a crystallographic plane is a (110) plane, the first gate insulating film has:

a first part positioned between the first inner wall and the first gate electrode; and a second part positioned between the second inner wall and the first gate electrode, and a film thickness of the second part is thicker than that of the first part.

(3) The imaging apparatus according to (2), wherein the second part is positioned at an end in a long axis direction of the cross section of the first gate electrode.

(4) The imaging apparatus according to (2) or (3), wherein the film thickness of the second part is 1.1 times or more and 2.0 times or less thicker than the film thickness of the first part.

(5) The imaging apparatus according to any one of (1) to (4), wherein the vertical transistor further has:

a second gate insulating film provided on a side of the first principal plane of the semiconductor substrate; and a second gate electrode which is provided on the second gate insulating film and which is in contact with the first gate electrode.

(6) The imaging apparatus according to any one of (1) to (5), further including:

a photoelectric conversion portion provided inside the semiconductor substrate; and an electric charge holding portion which is provided on a side of the first principal plane of the semiconductor substrate and which is configured to hold an electric charge generated by the photoelectric conversion portion, wherein an end in the long axis direction of the cross section of the first gate electrode is positioned on a side of the photoelectric conversion portion and another end in the long axis direction is positioned on a side of the electric charge holding portion, and the vertical transistor is configured to transfer an electric charge created in the photoelectric conversion portion to the electric charge holding portion.

(7) The imaging apparatus according to (6), wherein in a plan view in a normal direction of the first principal plane of the semiconductor substrate, a central part of the electric charge holding portion, a central part of the cross section of the first gate electrode, and a central part of the photoelectric conversion portion line up or approximately line up in a straight line.

(8) The imaging apparatus according to (5), wherein both ends in the long axis direction of the cross section of the first gate electrode are positioned under the second gate electrode.

(9) The imaging apparatus according to (5), wherein at least one of both ends in the long axis direction of the cross section of the first gate electrode protrudes from under the second gate electrode.

(10) The imaging apparatus according to any one of (1) to (9), wherein the vertical transistor has a plurality of the first gate electrodes, and the plurality of the first gate electrodes are disposed lined up at intervals in a short axis direction of the cross section.

(11) The imaging apparatus according to any one of (1) to (10), wherein the first principal plane is a plane of which a crystallographic plane is a (100) plane or equivalent to a (100) plane.

(12) An electronic device including:

an optical component;

an imaging apparatus into which light transmitted through the optical component is incident; and a signal processing circuit configured to process a signal output from the imaging apparatus, wherein the imaging apparatus includes:

a semiconductor substrate; and a vertical transistor provided on the semiconductor substrate, the semiconductor substrate is provided with a hole portion that opens on a side of a first principal plane, the vertical transistor has:

a first gate electrode provided inside the hole portion; and a first gate insulating film provided between an inner wall of the hole portion and the first gate electrode, and a cross section cut along a plane parallel to the first principal plane has a shape being elongated in a direction of a crystallographic orientation <100> of the semiconductor substrate.

REFERENCE SIGNS LIST

1 Gate insulating film
11, 11' First gate insulating film
12 Second gate insulating film
21, 21' First part

22, 22' Second part
100 Imaging apparatus
101*a*, 111*a* Surface
102, 102A, 102B, 102C, 102D, 102E Pixel
103 Pixel region (imaging region)
104 Vertical drive circuit
105 Column signal processing circuit
106 Horizontal drive circuit
107 Output circuit
108 Control circuit
109 Vertical signal line
110 Horizontal signal line
111, 111' Semiconductor substrate
112 Input/output terminal
120 Pixel separating portion
201 Solid-state imaging apparatus
210 Optical lens
211 Shutter apparatus
212 Drive circuit
213 Signal processing circuit
300 Electronic device
10402 Imaging portion
11000 Endoscopic operation system
11100 Endoscope
11101 Lens barrel
11102 Camera head
11110 Surgical instrument
11111 Pneumoperitoneum tube
11112 Energized treatment tool
11120 Support arm apparatus
11131 Operator (doctor)
11131 Operator
11132 Patient
11133 Patient bed
11200 Cart
11201 Camera control unit (CCU)
11202 Display apparatus
11203 Light source apparatus
11204 Input apparatus
11205 Treatment tool control apparatus
11206 Pneumoperitoneum apparatus
11207 Recorder
11208 Printer
11400 Transmission cable
11401 Lens unit
11402 Imaging portion
11403 Driving portion
11404 Communication portion
11405 Camera head control portion
11411 Communication portion
11412 Image processing portion
11413 Control portion
12000 Vehicle control system
12001 Communication network
12010 Drive system control unit
12020 Body system control unit
12030 External vehicle information detecting unit
12031 Imaging portion
12040 Internal vehicle information detecting unit
12041 Driver state detecting portion
12050 Integrated control unit
12051 Microcomputer
12052 Audio/image output portion
12061 Audio speaker
12062 Display portion
12063 Instrument panel
12100 Vehicle
12101 Imaging portion
12102 Imaging portion
12103 Imaging portion
12104 Imaging portion
12105 Imaging portion
12111 Imaging range
12112 Imaging range
12113 Imaging range
12114 Imaging range
CCU 11201 Imaging portion
CCU 11201 Camera head
E1, E1' Source terminal
E2, E2' Drain terminal
FD Floating diffusion
FDC, PDC, VGC Central part
GE Gate electrode
H1, H1' Hole portion
I In-vehicle network
IW1, IW1' First inner wall
IW2, IW2' Second inner wall
PD Photodiode
TG, TG' Second gate electrode
Tr Transfer transistor
VG, VG' First gate electrode

What is claimed is:

1. An imaging apparatus, comprising:
a semiconductor substrate;
a photoelectric conversion portion disposed inside the semiconductor substrate; and
a vertical transistor disposed on the semiconductor substrate such that, in a cross-sectional view, the vertical transistor is at least partially superimposed on the photoelectric conversion portion,
wherein the semiconductor substrate is provided with a hole portion that extends in a direction perpendicular to a first principal plane of the semiconductor substrate,
wherein the first principal plane corresponds to an uppermost surface of the semiconductor substrate,
wherein the vertical transistor includes:
a first gate electrode provided inside the hole portion;
a first gate insulating film provided between an inner wall of the hole portion and the first gate electrode;
a second gate insulating film disposed above the first principal plane of the semiconductor substrate; and
a second gate electrode which is in contact with the first gate electrode,
wherein a length of the first gate electrode is greater than a length of the second gate electrode,
wherein the length of the first gate electrode and the length of the second gate electrode are perpendicular to a light-incident surface of the imaging apparatus, and
wherein a cross section of the first gate electrode cut along a plane parallel to the first principal plane has a shape elongated in a direction of a crystallographic orientation <100> of the semiconductor substrate.

2. The imaging apparatus according to claim 1, wherein the inner wall includes:
a first inner wall of which a crystallographic plane is a (100) plane; and
a second inner wall of which a crystallographic plane is a (110) plane,
wherein the first gate insulating film includes:
a first part positioned between the first inner wall and the first gate electrode; and
a second part positioned between the second inner wall and the first gate electrode, and wherein a film thickness of the second part is thicker than that of the first part.

3. The imaging apparatus according to claim 2, wherein the second part is positioned at an end in a long axis direction of the cross section of the first gate electrode.

4. The imaging apparatus according to claim 2, wherein the film thickness of the second part is 1.1 times or more and 2.0 times or less thicker than the film thickness of the first part.

5. The imaging apparatus according to claim 1, as wherein the second gate insulating film is interposed between the second gate electrode and the first principal plane of the semiconductor substrate.

6. The imaging apparatus according to claim 1, further comprising:

an electric charge holding portion which is provided on a side of the first principal plane of the semiconductor substrate and which is configured to hold an electric charge generated by the photoelectric conversion portion, wherein an end in a long axis direction of the cross section of the first gate electrode is positioned on a side of the photoelectric conversion portion and another end in the long axis direction is positioned on a side of the electric charge holding portion, and wherein the vertical transistor is configured to transfer an electric charge created in the photoelectric conversion portion to the electric charge holding portion.

7. The imaging apparatus according to claim 6, wherein in a plan view in a normal direction of the first principal plane of the semiconductor substrate, a central part of the electric charge holding portion, a central part of the cross section of the first gate electrode, and a central part of the photoelectric conversion portion line up in a straight line.

8. The imaging apparatus according to claim 1, wherein both ends in a long axis direction of the cross section of the first gate electrode are positioned under the second gate electrode.

9. The imaging apparatus according to claim 1, wherein at least one of both ends in a long axis direction of the cross section of the first gate electrode protrudes from under the second gate electrode.

10. The imaging apparatus according to claim 1, wherein the vertical transistor has a plurality of the first gate electrodes, and wherein the plurality of the first gate electrodes are disposed lined up at intervals in a short axis direction of the cross section.

11. The imaging apparatus according to claim 1, wherein the first principal plane is a plane of which a crystallographic plane is a (100) plane or equivalent to a (100) plane.

12. An electronic device, comprising:

an optical component;

an imaging apparatus into which light transmitted through the optical component is incident; and a signal processing circuit configured to process a signal output from the imaging apparatus, wherein the imaging apparatus includes:

a semiconductor substrate;

a photoelectric conversion portion disposed inside the semiconductor substrate; and a vertical transistor disposed on the semiconductor substrate such that, in a cross-sectional view, the vertical transistor is at least partially superimposed on the photoelectric conversion portion, wherein the semiconductor substrate is provided with a hole portion that extends in a direction perpendicular to a first principal plane of the semiconductor substrate, wherein the first principal plane corresponds to an uppermost surface of the semiconductor substrate, wherein the vertical transistor has:

a first gate electrode provided inside the hole portion;

a first gate insulating film provided between an inner wall of the hole portion and the first gate electrode;

a second gate insulating film disposed above the first principal plane of the semiconductor substrate; and a second gate electrode which is in contact with the first gate electrode, wherein a length of the first gate electrode is greater than a length of the second gate electrode, wherein the length of the first gate electrode and the length of the second gate electrode are perpendicular to a light-incident surface of the imaging apparatus, and wherein a cross section of the first gate electrode cut along a plane parallel to the first principal plane has a shape elongated in a direction of a crystallographic orientation <100> of the semiconductor substrate.

13. The electronic device according to claim 12, wherein the inner wall includes:

a first inner wall of which a crystallographic plane is a (100) plane; and a second inner wall of which a crystallographic plane is a (110) plane, wherein the first gate insulating film includes:

a first part positioned between the first inner wall and the first gate electrode; and a second part positioned between the second inner wall and the first gate electrode, wherein a film thickness of the second part is thicker than that of the first part.

14. The electronic device according to claim 13, wherein the second part is positioned at an end in a long axis direction of the cross section of the first gate electrode.

15. The electronic device according to claim 13, wherein the film thickness of the second part is 1.1 times or more and 2.0 times or less thicker than the film thickness of the first part.

16. The electronic device according to claim 12, wherein t the second gate insulating film is interposed between the second gate electrode and the first principal plane of the semiconductor substrate.

17. The electronic device according to claim 12, further comprising:

an electric charge holding portion which is provided on a side of the first principal plane of the semiconductor substrate and which is configured to hold an electric charge generated by the photoelectric conversion portion, wherein an end in a long axis direction of the cross section of the first gate electrode is positioned on a side of the photoelectric conversion portion and another end in the long axis direction is positioned on a side of the electric charge holding portion, and wherein the vertical transistor is configured to transfer an electric charge created in the photoelectric conversion portion to the electric charge holding portion.

18. The electronic device according to claim 17, wherein in a plan view in a normal direction of the first principal plane of the semiconductor substrate, a central part of the electric charge holding portion, a central part of the cross section of the first gate electrode, and a central part of the photoelectric conversion portion line up in a straight line.

19. The electronic device according to claim 12, wherein the vertical transistor has a plurality of the first gate electrodes, and wherein the plurality of the first gate electrodes are disposed lined up at intervals in a short axis direction of the cross section.

20. The electronic device according to claim 12, wherein the first principal plane is a plane of which a crystallographic plane is a (100) plane or equivalent to a (100) plane.

* * * * *